(12) United States Patent
Wang et al.

(10) Patent No.: US 10,163,833 B2
(45) Date of Patent: Dec. 25, 2018

(54) MULTICHIP MODULES AND METHODS OF FABRICATION

(71) Applicant: Invensas Corporation, San Jose, CA (US)

(72) Inventors: Liang Wang, Milpitas, CA (US); Rajesh Katkar, San Jose, CA (US); Hong Shen, Palo Alto, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/584,961

(22) Filed: May 2, 2017

(65) Prior Publication Data

US 2017/0236794 A1     Aug. 17, 2017

Related U.S. Application Data

(62) Division of application No. 14/809,036, filed on Jul. 24, 2015, now Pat. No. 9,666,559.

(Continued)

(51) Int. Cl.
*H01L 23/02* (2006.01)
*H01L 23/00* (2006.01)
(Continued)

(52) U.S. Cl.
CPC .............. *H01L 24/09* (2013.01); *B81B 7/008* (2013.01); *B81C 1/0023* (2013.01);
(Continued)

(58) Field of Classification Search
CPC ..... H01L 23/5389; H01L 24/19; H01L 24/48; H01L 24/49; H01L 21/565;
(Continued)

(56) References Cited

U.S. PATENT DOCUMENTS

| 4,088,986 A | 5/1978 | Boucher |
| 6,455,785 B1 | 9/2002 | Sakurai et al. |

(Continued)

FOREIGN PATENT DOCUMENTS

| WO | 2010/151350 A1 | 12/2010 |
| WO | 2013/119309 A1 | 8/2013 |

OTHER PUBLICATIONS

Gorto, Jeffrey, "Polymer Challenges in Electronic Packaging: Part 7—Embedded Wafer Level Packaging Process Flow," Polymer Innovation Blog (Practical tips and advice for polymer, innovation and product development professionals), Nov. 25, 2013.

(Continued)

*Primary Examiner* — Luan C Thai

(57) ABSTRACT

In a multi-chip module (MCM), a "super" chip (110N) is attached to multiple "plain" chips (110F' "super" and "plain" chips can be any chips). The super chip is positioned above the wiring board (WB) but below at least some of plain chips (110F). The plain chips overlap the super chip. Further, the plain chips' low speed IOs can be connected to the WB by long direct connections such as bond wires (e.g. BVAs) or solder stacks; such connections can be placed side by side with the super chip. Such connections can be long, so the super chip is not required to be thin. Also, if through-substrate vias (TSVs) are omitted, the manufacturing yield is high and the manufacturing cost is low. Other structures are provided that combine the short and long direct connections to obtain desired physical and electrical properties.

14 Claims, 19 Drawing Sheets

Related U.S. Application Data

(60) Provisional application No. 62/046,395, filed on Sep. 5, 2014.

(51) Int. Cl.

| | | |
|---|---|---|
| *H01L 25/065* | (2006.01) | |
| *H01L 23/498* | (2006.01) | |
| *H01L 23/367* | (2006.01) | |
| *H01L 25/18* | (2006.01) | |
| *B81B 7/00* | (2006.01) | |
| *H01L 23/538* | (2006.01) | |
| *H01L 21/56* | (2006.01) | |
| *H01L 25/00* | (2006.01) | |
| *H01L 23/48* | (2006.01) | |
| *H01L 21/768* | (2006.01) | |
| *B81C 1/00* | (2006.01) | |
| *H01L 23/31* | (2006.01) | |
| *H01L 25/10* | (2006.01) | |
| *H01L 23/34* | (2006.01) | |

(52) U.S. Cl.
CPC ...... *H01L 21/565* (2013.01); *H01L 21/76877* (2013.01); *H01L 23/3107* (2013.01); *H01L 23/3157* (2013.01); *H01L 23/34* (2013.01); *H01L 23/367* (2013.01); *H01L 23/481* (2013.01); *H01L 23/49838* (2013.01); *H01L 23/5389* (2013.01); *H01L 24/06* (2013.01); *H01L 24/17* (2013.01); *H01L 24/19* (2013.01); *H01L 24/20* (2013.01); *H01L 24/33* (2013.01); *H01L 24/48* (2013.01); *H01L 24/49* (2013.01); *H01L 24/89* (2013.01); *H01L 24/96* (2013.01); *H01L 25/0652* (2013.01); *H01L 25/0655* (2013.01); *H01L 25/0657* (2013.01); *H01L 25/10* (2013.01); *H01L 25/105* (2013.01); *H01L 25/18* (2013.01); *H01L 25/50* (2013.01); *B81B 2207/07* (2013.01); *H01L 2224/0401* (2013.01); *H01L 2224/04042* (2013.01); *H01L 2224/04105* (2013.01); *H01L 2224/06181* (2013.01); *H01L 2224/08225* (2013.01); *H01L 2224/09181* (2013.01); *H01L 2224/12105* (2013.01); *H01L 2224/16145* (2013.01); *H01L 2224/33517* (2013.01); *H01L 2224/48135* (2013.01); *H01L 2224/48137* (2013.01); *H01L 2224/48227* (2013.01); *H01L 2224/73204* (2013.01); *H01L 2224/73207* (2013.01); *H01L 2224/73209* (2013.01); *H01L 2224/73253* (2013.01); *H01L 2224/73257* (2013.01); *H01L 2224/73265* (2013.01); *H01L 2224/80001* (2013.01); *H01L 2224/81005* (2013.01); *H01L 2224/92124* (2013.01); *H01L 2224/92133* (2013.01); *H01L 2225/0651* (2013.01); *H01L 2225/06506* (2013.01); *H01L 2225/06513* (2013.01); *H01L 2225/06517* (2013.01); *H01L 2225/06527* (2013.01); *H01L 2225/06548* (2013.01); *H01L 2225/06589* (2013.01); *H01L 2924/00014* (2013.01); *H01L 2924/014* (2013.01); *H01L 2924/01029* (2013.01); *H01L 2924/07802* (2013.01); *H01L 2924/14* (2013.01); *H01L 2924/1461* (2013.01); *H01L 2924/1511* (2013.01); *H01L 2924/15153* (2013.01); *H01L 2924/15192* (2013.01); *H01L 2924/18161* (2013.01); *H01L 2924/18162* (2013.01); *H01L 2924/3511* (2013.01)

(58) Field of Classification Search
CPC ........... H01L 21/76877; H01L 23/3107; H01L 23/3157; H01L 23/34; H01L 23/367; H01L 23/481; H01L 23/49838; H01L 24/06; H01L 24/09; H01L 24/17; H01L 24/20; H01L 24/33; H01L 24/89
USPC ........................................................ 257/686
See application file for complete search history.

(56) References Cited

U.S. PATENT DOCUMENTS

| | | | |
|---|---|---|---|
| 7,161,484 | B2 | 1/2007 | Tsoukalis |
| 7,402,901 | B2 * | 7/2008 | Hatano ............... H01L 23/5389 257/684 |
| 7,641,619 | B2 | 1/2010 | Penner |
| 8,008,764 | B2 | 8/2011 | Joseph et al. |
| 8,154,844 | B2 | 4/2012 | Brown |
| 8,227,904 | B2 | 7/2012 | Braunisch et al. |
| 8,354,297 | B2 * | 1/2013 | Pagaila ................... H01L 25/16 257/678 |
| 8,536,693 | B2 | 9/2013 | Dungan et al. |
| 8,618,659 | B2 | 12/2013 | Sato et al. |
| 8,704,364 | B2 | 4/2014 | Banijamali |
| 8,772,087 | B2 | 7/2014 | Barth et al. |
| 8,822,281 | B2 | 9/2014 | Pagaila et al. |
| 8,872,349 | B2 | 10/2014 | Chiu et al. |
| 8,901,748 | B2 | 12/2014 | Manusharow et al. |
| 8,912,670 | B2 | 12/2014 | Teh et al. |
| 8,940,630 | B2 | 1/2015 | Damberg et al. |
| 8,999,756 | B2 | 4/2015 | Barth et al. |
| 9,126,236 | B2 | 9/2015 | Roos et al. |
| 9,153,552 | B2 | 10/2015 | Teh et al. |
| 9,159,690 | B2 | 10/2015 | Chiu et al. |
| 9,171,816 | B2 | 10/2015 | Teh et al. |
| 9,190,380 | B2 | 11/2015 | Teh et al. |
| 9,224,693 | B2 | 12/2015 | Pagaila et al. |
| 9,269,701 | B2 | 2/2016 | Starkston et al. |
| 9,275,955 | B2 | 3/2016 | Mahajan et al. |
| 9,275,971 | B2 | 3/2016 | Chiu et al. |
| 9,349,703 | B2 | 5/2016 | Chiu et al. |
| 9,379,074 | B2 | 6/2016 | Uzoh et al. |
| 9,379,090 | B1 | 6/2016 | Syed et al. |
| 9,402,312 | B2 | 7/2016 | Shen et al. |
| 9,419,070 | B2 | 8/2016 | Lenive et al. |
| 9,437,566 | B2 | 9/2016 | Katkar et al. |
| 9,502,390 | B2 | 11/2016 | Caskey et al. |
| 2009/0199884 | A1 | 8/2009 | Lessing |
| 2012/0168943 | A1 | 7/2012 | Gan et al. |
| 2012/0199960 | A1 | 8/2012 | Cosue et al. |
| 2013/0265733 | A1 | 10/2013 | Herbsommer et al. |
| 2015/0051987 | A1 | 2/2015 | Yew et al. |
| 2015/0061130 | A1 | 3/2015 | Meyer |
| 2015/0091145 | A1 | 4/2015 | Lin et al. |
| 2015/0172893 | A1 | 6/2015 | St. Germain et al. |
| 2015/0178456 | A1 | 6/2015 | Stransky-Heilkron et al. |
| 2015/0182128 | A1 | 7/2015 | Magi |
| 2015/0193595 | A1 | 7/2015 | McNamara et al. |
| 2015/0255366 | A1 | 9/2015 | Chung |
| 2015/0325507 | A1 | 11/2015 | Uzoh et al. |
| 2015/0364422 | A1 | 12/2015 | Zhai et al. |

OTHER PUBLICATIONS

International Search Report and Written Opinion dated Jan. 15, 2016 for PCT Application No. PCT/US2015/047781.
International Search Report and Written Opinion dated Mar. 16, 2017 for PCT Application No. PCT/US2015/047781, 11 pages.
Invensas Corporation, "High Performance BVA PoP Package for Mobile Systems," May 2013 by Invensas Corporation, San Jose, California, USA.
Prashant, Meenakshi et al., "Cost Effective 300mm Large Scale, eWLB (Embedded Wafer Level BGA) Technology," 2011 Electronics Packaging Technology Conference (EPTC) Proceedings.
Raghunathan, Vijay et al., A Survey of Techniques for Energy Efficient OnChip Communication, DAC 2003, Jun. 2-6, 2003, Anaheim, California, USA, Copyright 2003 ACM 1581136889/03/ 0006, 6 pages.

(56) References Cited

OTHER PUBLICATIONS

STMicroelectronics, "Semiconductor Solutions for Healthcare Applications," www.stc.com/medical, 12 pages, pulled Apr. 20, 2015.

Yilmaz, Tuba et al., "Detecting Vital Signs with Wearable Wireless Sensors," Sensors (Base), 2010, 10(12): 10837-10862, Pub. Online Dec. 2, 2010, doi: 10.3390/s101210837.

Yoon, Seung Wook et al., "eWLB (Embedded Wafer Level BGA) Technology: Next Generation 3D Packaging Solutions," Wafer Level Packaging Conference Proceedings, Santa Clara, California, USA, Oct. 27-30, 2009.

Zakel, E. et al., "High Speed Laser Solder Jetting Technology for Optoelectronics and MEMs Packaging," ICEP 2002.

Zhou, Fuchao, Mobile Personal Health Care System for Patients With Diabetes, a thesis submitted to the graduate faculty in partial fulfillment of the requirements for the degree of Masters of Science, Major: Computer Science, Iowa State University, Ames, Iowa, 2011.

\* cited by examiner

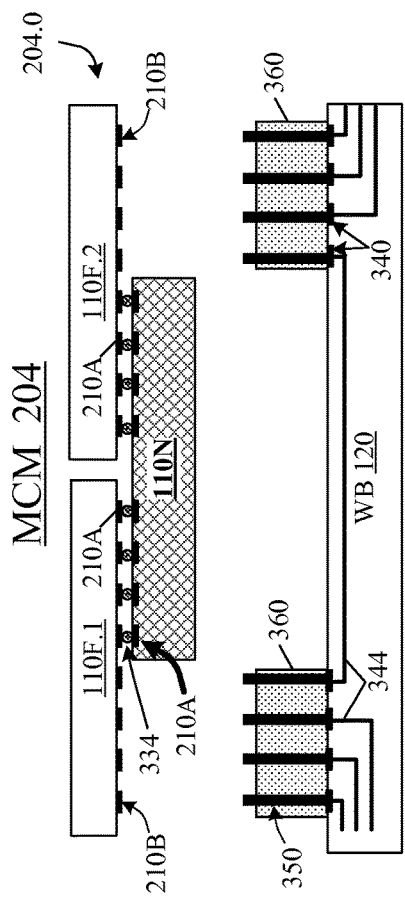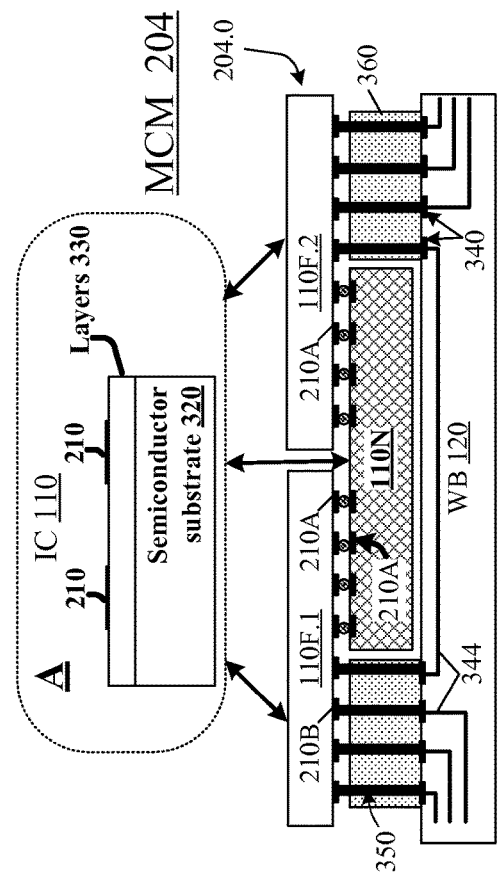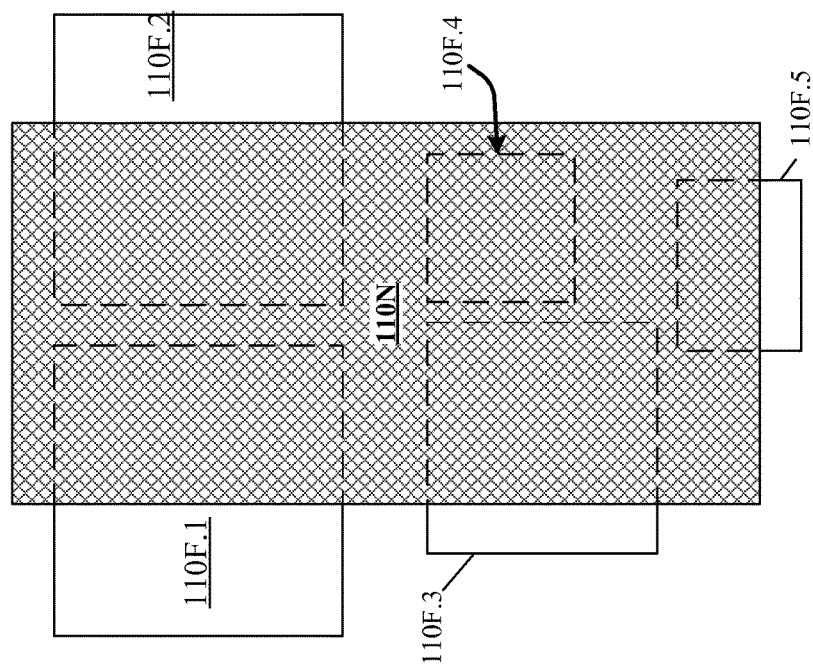

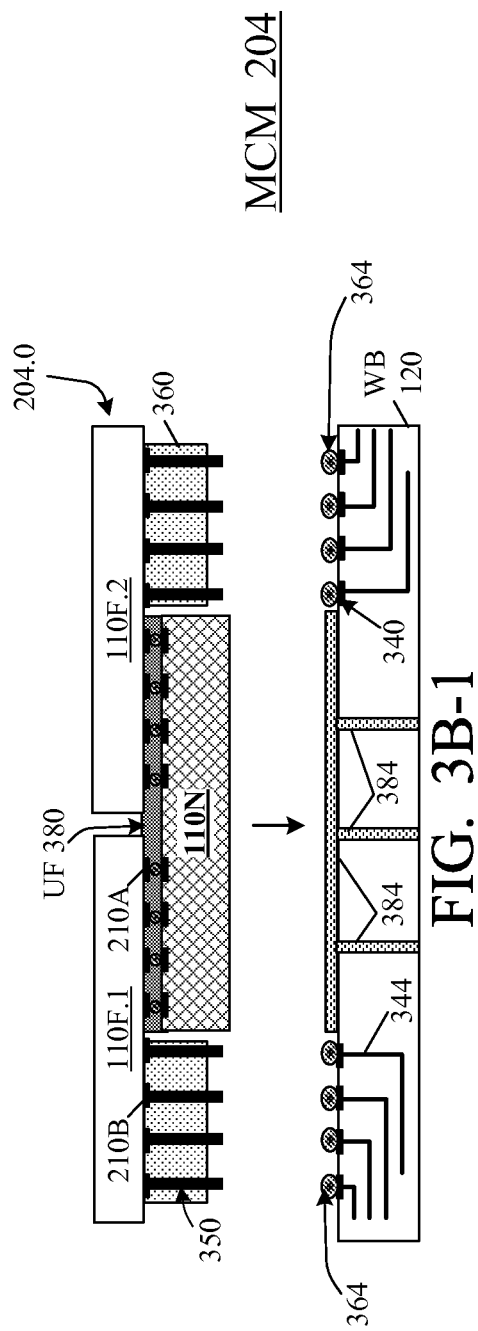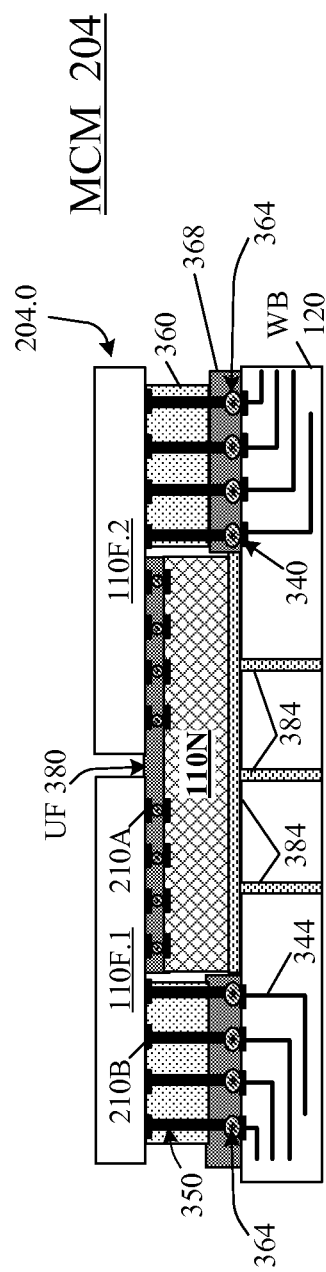

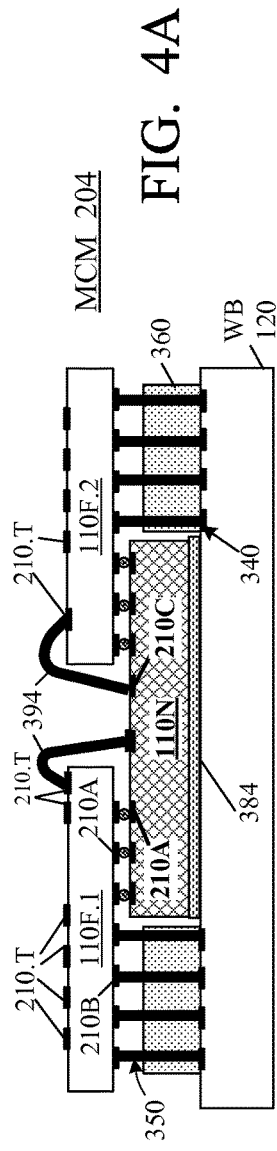
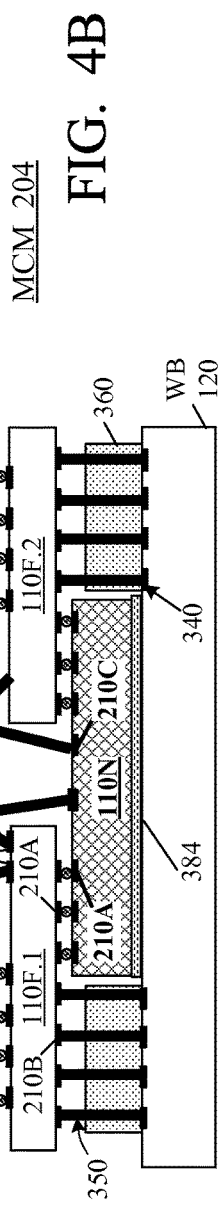
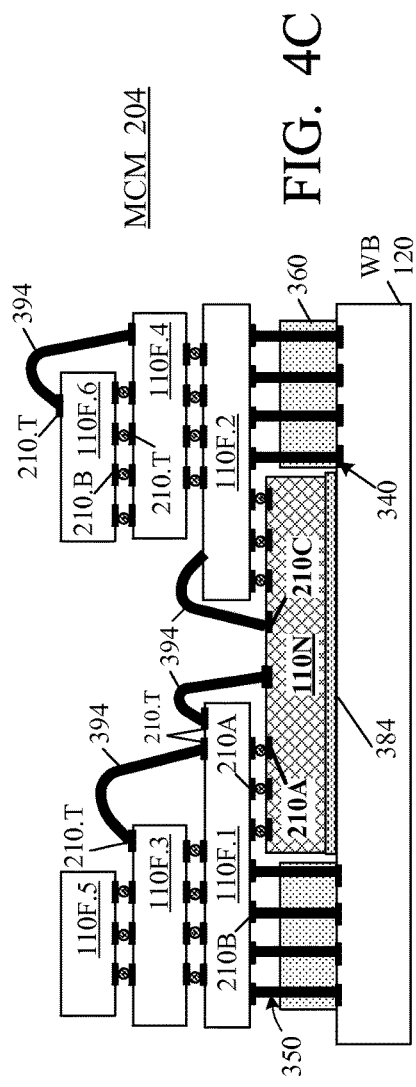
FIG. 4A
FIG. 4B
FIG. 4C

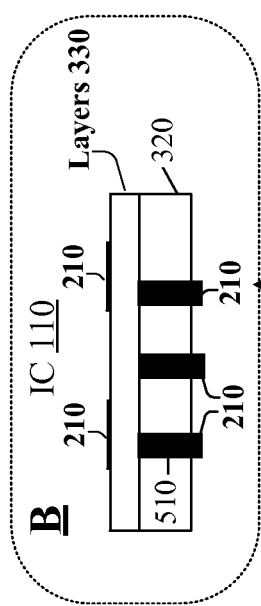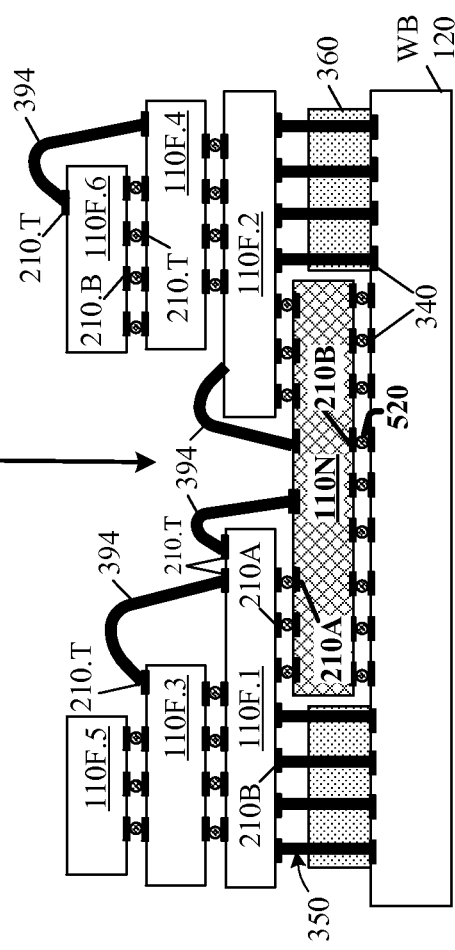
FIG. 5

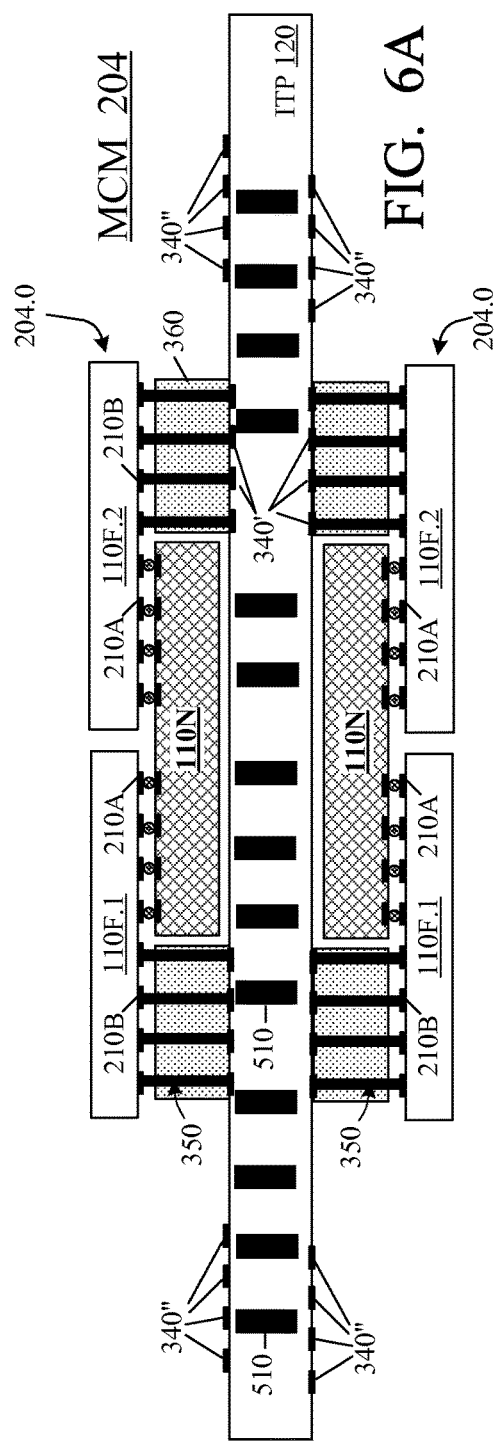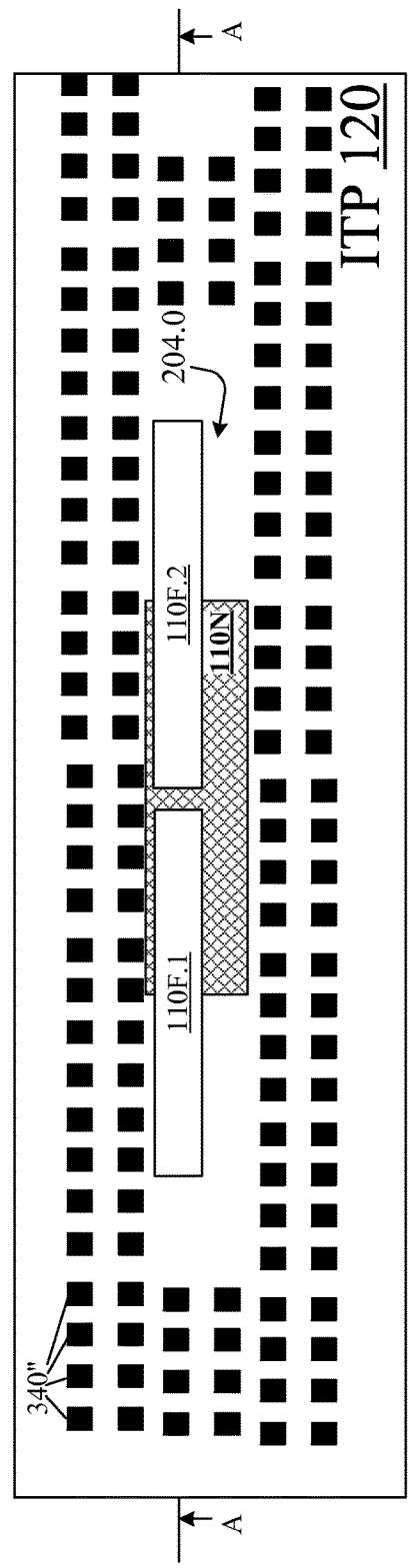

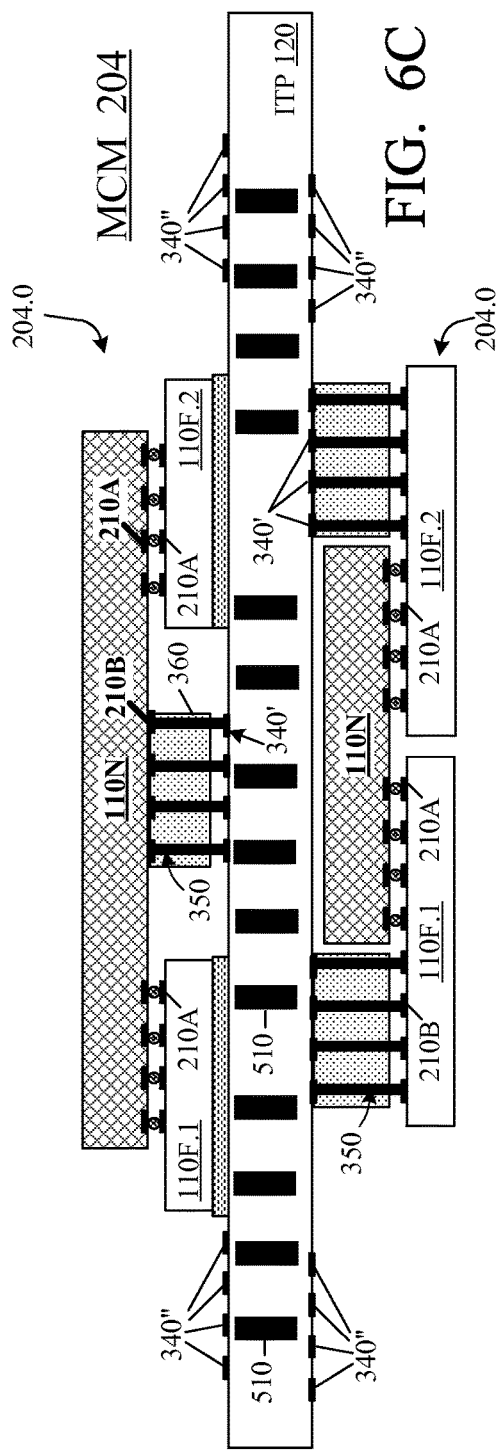
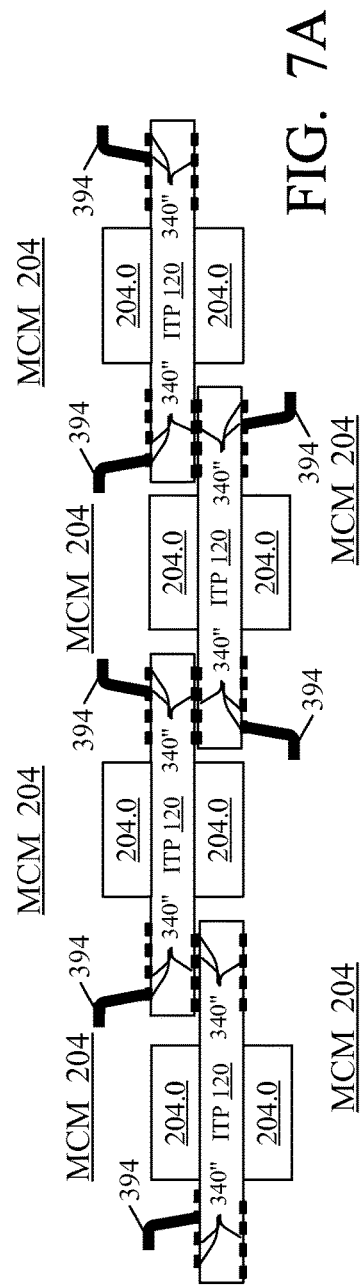

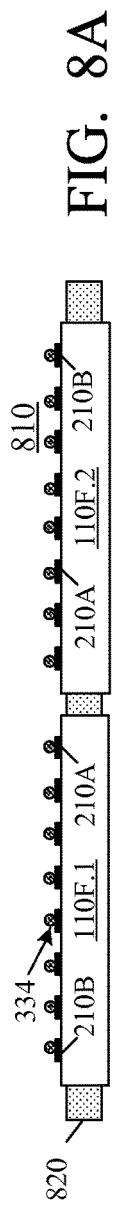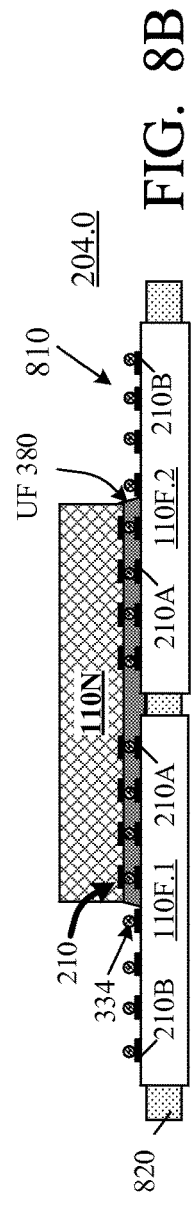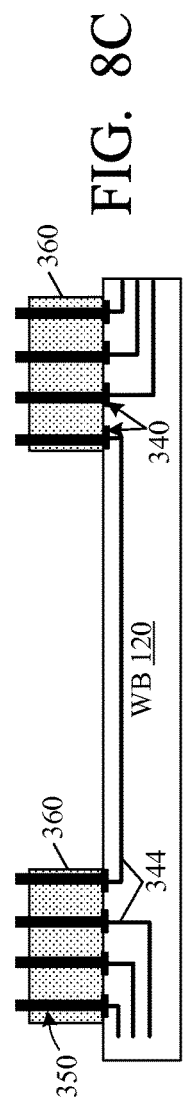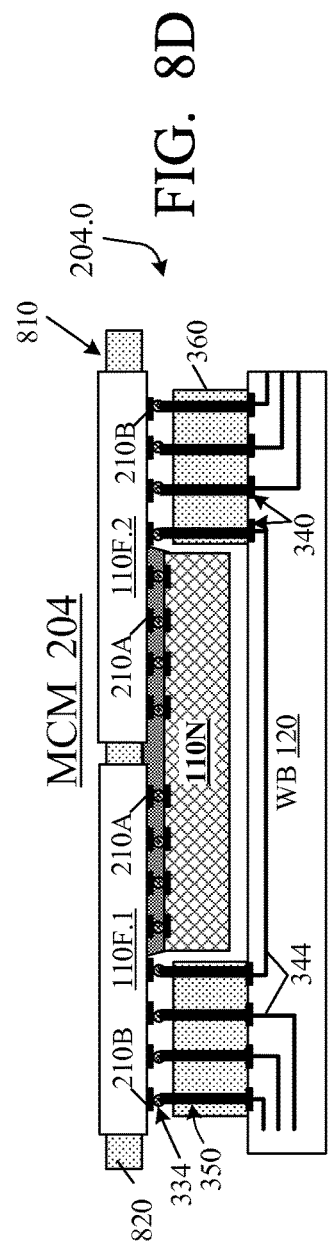

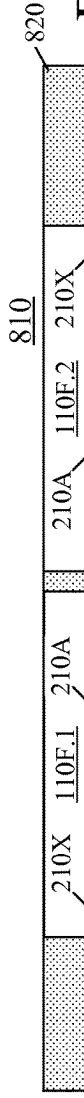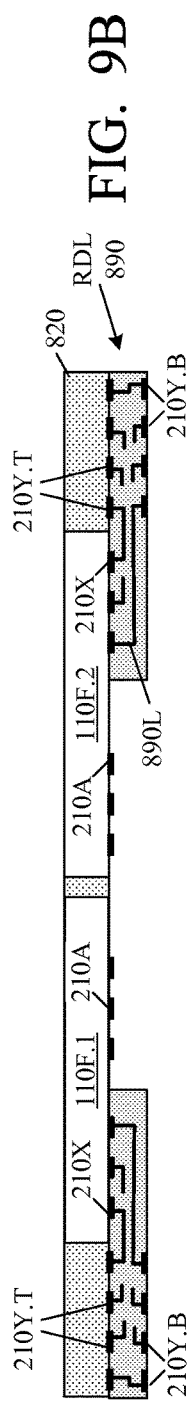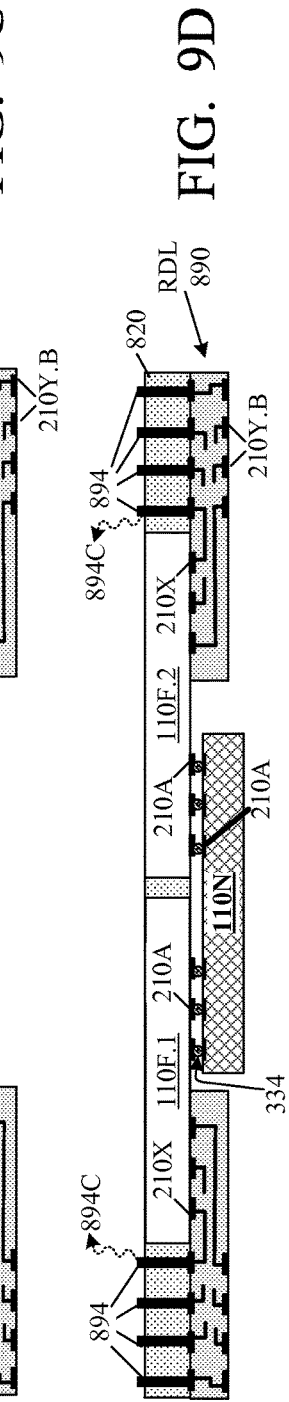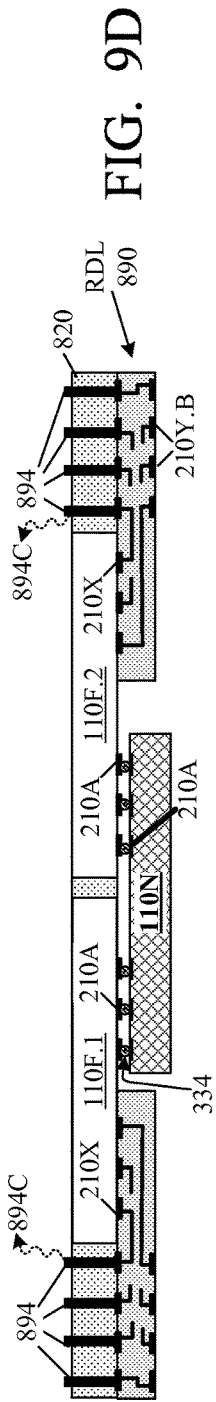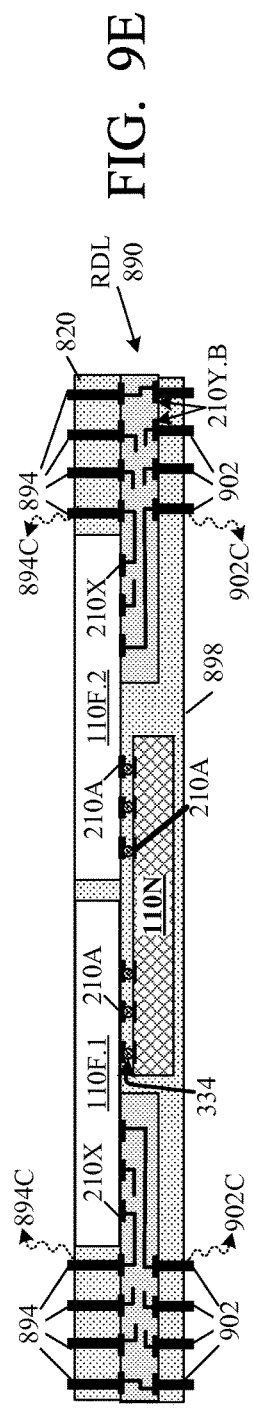
FIG. 9A
FIG. 9B
FIG. 9C
FIG. 9D
FIG. 9E

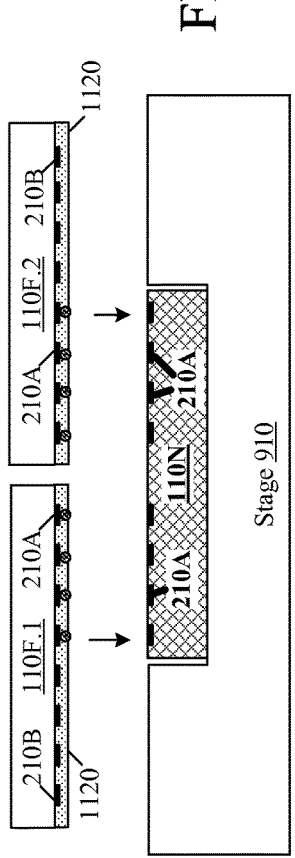
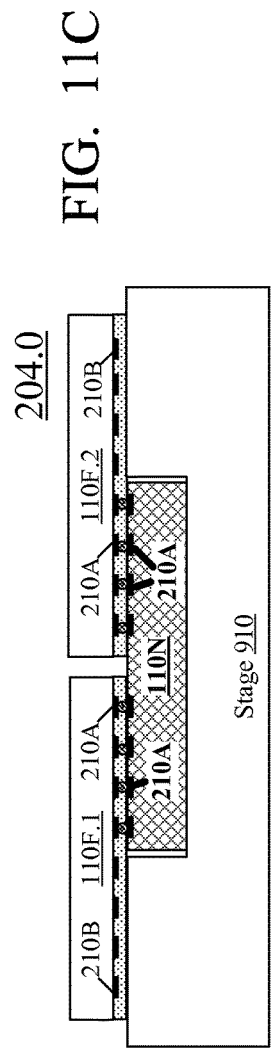
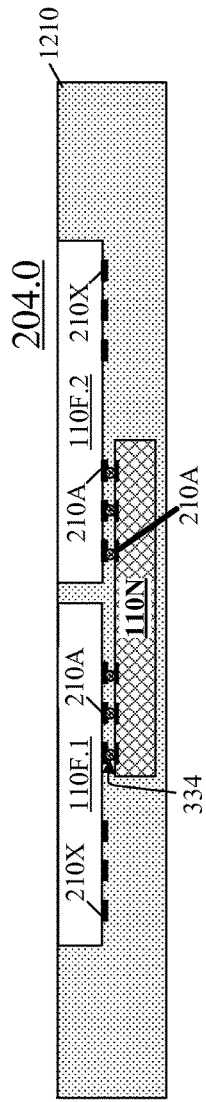

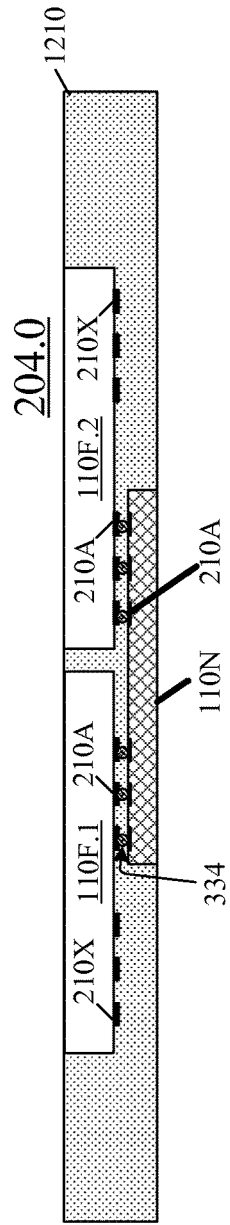
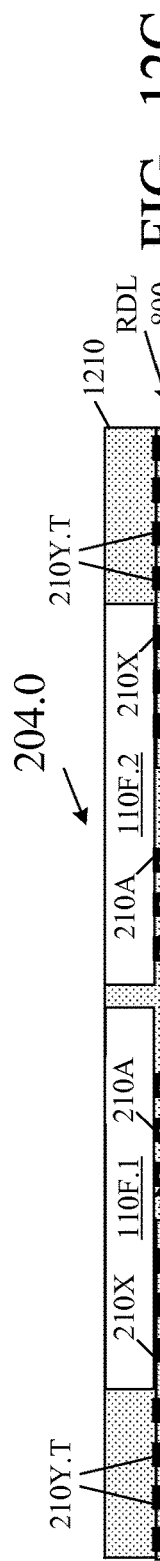
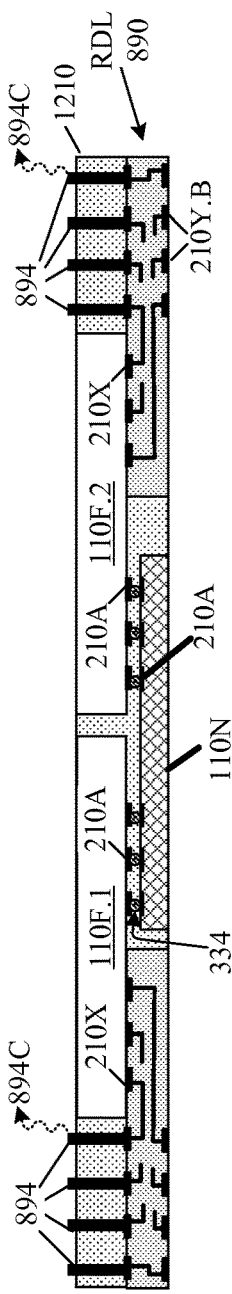

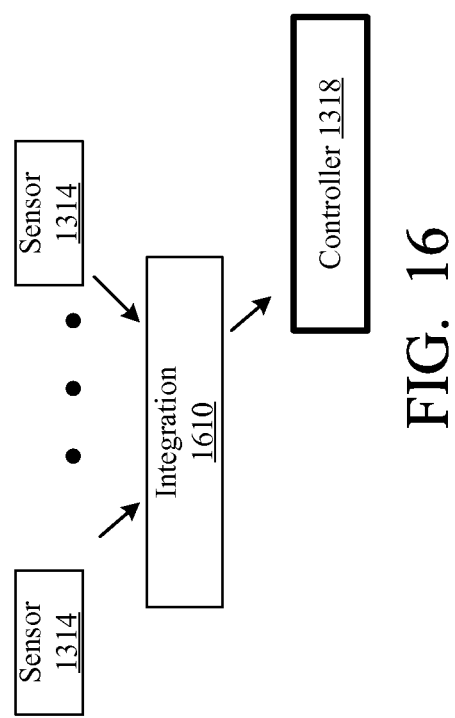

MULTICHIP MODULES AND METHODS OF FABRICATION

CROSS-REFERENCE TO RELATED APPLICATIONS

The present application is a divisional of and claims priority to and the benefit of U.S. patent application Ser. No. 14/809,036, filed 24 Jul. 2015, which claims priority to U.S. provisional patent application No. 62/046,395, filed 5 Sep. 2014, each of the aforementioned applications of which is incorporated herein by reference in its entirety for all purposes.

BACKGROUND OF THE INVENTION

The present invention relates to integrated circuits, and more particularly to multi-chip modules (MCMs).

The following documents relate to integrated circuits and may be of background interest:
   U.S. pre-grant patent publication 2009/0267238 (Oct. 29, 2009; Joseph et al.).
   U.S. pre-grant patent publication 2012/0020027 (Jan. 26, 2012, Dungan et al.)

A multi-chip module (MCM) is an assembly of multiple components, with one or more components being integrated circuits (ICs), such that the assembly can be used like a single semiconductor integrated circuit. A usual (not multi-chip) semiconductor integrated circuit can be manufactured as a wafer or as a die (single-chip IC) formed in a wafer and later separated from the wafer (when the wafer is diced); multiple ICs can be manufactured in a wafer simultaneously. The ICs and possibly discrete circuits and possibly other components (like non-semiconductor packaging substrates including printed circuit boards, interposers, and possibly others) can be assembled in an MCM. In this disclosure, the words "die" and "chip" are synonymous.

FIG. 1 illustrates an MCM which includes multiple dies 110 (110F.1, 110F.2, etc.) attached to a packaging substrate 120, e.g. a wiring board (WB) such as a PCB or an interposer. WB 120 has interconnect lines (not shown) for interconnecting the dies. The MCM may combine dies of different types, and some of these types are illustrated in FIG. 1. In this example, dies 110F include a CPU (central processing unit) 110F.1; an IVR die (Interactive Voice Recognition) 110F.2; an audio chip 110F.3 which may include a microphone and/or a speaker and/or audio signal processing circuitry; a Power Management Integrated Circuit (PMIC) 110F.4; an actuator die 110F.5; an RF (radio frequency) communication die 110F.6; a GPU (graphics processing unit) 110F.7; an optics die 110F.8 (e.g. optic transducer and/or processing circuitry), a Solid State Drive (SSD) 110F.9; Random Access Memory (RAM) 110F.10; Digital Signal Processor (DSP) 110F.11; and a sensor chip 110F.12 (e.g. optical sensor, pressure sensor, or some other type). We will refer to the CPU, IVR and other dies shown in the drawing as "function dies" or "function chips".

To reduce manufacturing costs, the WB can be made using organic (e.g. insulating polymer) and/or ceramic and/or glass and/or composite materials. Such WBs can be inexpensively fabricated using molding, printing, or other techniques. For example, a WB can be a laminate of ceramic or organic or composite material layers with conductive lines on each layer which together form an interconnect network that interconnects the WB's contact pads (not shown) attached to the dies. Such WBs can be less expensive to make than those made of silicon. However, the minimum feature size of organic or ceramic or composite WBs is typically larger than for silicon chips. In particular, the minimal interconnect width and the spacing between the interconnects can be 1000 times larger than in silicon. This is partially due to the fact that many organic, ceramic, and composite materials are not as flat as polished silicon, i.e. they have a rougher surface; therefore, photolithography is less precise. Further, such WBs are often patterned using coarser and less expensive methods than photolithography, such as screen printing or laser ablation. Also, the conductive and other features may have to be thicker than for silicon chips. We will call such WBs "coarse WBs" for ease of reference. The term "WB" includes both coarse and non-coarse (e.g. semiconductor or glass) WBs unless noted otherwise.

Thus, the coarse WB circuitry is larger, and has larger pitches between conductive lines and solder balls and other features. A silicon or glass WB provides denser packed circuitry (with smaller pitch), but is more expensive.

In view of the disadvantages of coarse WBs, a coarse WB can be supplemented by a silicon interposer positioned between at least some of the chips and the coarse WB. Thus, some of the chips are attached to the silicon interposer rather than WB. The silicon interposer has contact pads on top for attachment to the chips, and has other contact pads on the bottom for attachment to the WB. The interposer has through-substrate vias (TSVs) used to connect its top contact pads to the bottom contact pads. However, the TSVs are expensive to fabricate, and they are especially difficult to fabricate if the interposer is thick. But thin interposers are hard to handle, they easily break, and their warpage complicates the manufacturing and creates stresses that can break the MCM during operation.

SUMMARY

This section summarizes some features of the invention. Other features may be described in the subsequent sections.

According to some embodiments, densely packed assemblies are provided which reduce or eliminate the use of TSVs. In particular, in some embodiments, rather than use a conventional interposer, we use a chip having contact pads on only one side. For ease of reference, we will call this chip a "super chip" even though it may be an ordinary chip—indeed, many chips have contact pads (IOs) on only one side. (We use the terms "contact pads", "IOs", and "inputs/outputs" interchangeably, to refer to a chip's contact pads accessible for attachment to other circuit elements; these terms can be used for input-only and output-only contact pads, i.e. contact pads used only as inputs or only as outputs, in addition to a contact pad used for both input and output.)

In some embodiments, the super chip is attached to multiple other chips; we will call such chips "plain" chips for ease of reference; any chip can be a plain chip. Let us suppose for ease of reference that the super chip and the plain chips overlie a possibly coarse WB. In some embodiments, the super chip has IOs only on the top side, and the plain chips overlie the super chip and have their IOs on the bottom side attached to the super chip's IOs. Further, one or more plain chips overlap the super chip, i.e. they extend beyond the super chip and have additional bottom-side IOs connected to the WB by "direct" connections; by a "direct" connection of IOs to each other we mean an electrically conductive connection that is not part of any other integrated circuit (e.g. a chip), nor is it a part of any WB. A direct connection can be a discrete wire, a solder stack, or a pillar (possibly copper pillar) projecting out of the chip or WB, or a combination of pillars and/or wires and/or solder stacks and/or other conductive elements which are not part of any other integrated circuit or WB (unlike a TSV for example—TSVs are part of an integrated circuit or a WB). The term "direct connection" also includes a flip-chip type connection, e.g. a thin solder layer or conductive polymeric adhesive or diffusion bonding. A direct connection can be encapsulated into a molding compound (e.g. cured organic polymeric resin).

We will use the term "attachment" for direct connections that exclude discrete non-solder wires. For example, if two IOs bonded together by a thin solder layer or by diffusion bonding, the bond is called "attachment". Also, when describing joinder of arbitrary structures such as chips and WBs, possibly by a dielectric adhesive, "attachment" is used in its usual sense, not limited to electrically conductive structures.

In some embodiments, the super chip overlies the plain chips and has IOs on the bottom side. Some of these IOs are attached to the plain chips, and other bottom-side IOs of the super chip are positioned on the super chip's portion extending beyond the plan chips and are directly connected to the WB.

If the IOs of each chip are only on one side of the chip, then no TSVs are needed. However, some embodiments use chips with TSVs.

For ease of reference, a chip's IOs attached to another chip will be called "type A", and IOs directly connected to the WB will be called "type B". In some embodiments, the WB connections (for type B IOs) are long, e.g. solder stacks or bond wires. These connections are longer than the thickness of a super chip or a plain chip.

Regarding our terminology, a super chip is any chip having IOs on one side that are attached to different chips. A super chip may have IOs on the other side too, and may or may not have TSVs. At least one plain chip attached to a super chip will extend beyond the super chip. A plain chip may or may not have IOs on both sides, and may or may not have TSVs. Further, a chip can be both a plain chip and a super chip. For example, if a plain chip underlies two super chips and is attached to both of the super chips, then the plain chip is a super chip too, and the overlying super chips are plain chips relative to the underlying chip. A chip may be neither a super chip nor a plain chip; e.g. if a chip is attached only to a WB, then the chip is neither super nor plain.

In some embodiments, the super chip is used just to connect the plain chips to each other, similar to a bridge chip disclosed in the aforementioned U.S. pre-grant patent publication 2009/0267238 (Joseph et al.), incorporated herein by reference. See also U.S. pre-grant patent publication 2012/0020027 (Dungan et al.), incorporated herein by reference.

The chips can be based on silicon or other semiconductor materials. In some embodiments, the super chip provides fast interconnection between the plain chips' IOs attached to the super chip. Therefore, in some embodiments, for at least some of the chips, we compartmentalize their IOs into separate categories of high-speed and low-speed requirements. We avoid using a coarse WB for routing high-speed signals; thus, the high-speed IOs are preferably type-A, attached to high-speed IOs of other chips. In particular, the high-speed IOs of the plain chips can be attached to the super chip's high-speed IOs so that the signals at these IOs can be transferred between the plain chips or processed by the super chip fast to meet the speed and other electrical requirements (e.g. low voltage or low power requirements).

The low-speed IOs (e.g. for ground voltage, power supply, reference voltages, and other DC or slow AC signals) can be type B, i.e. attached to the coarse WB and possibly interconnected through the coarse WB to take advantage of the lower cost of the coarse WB.

As noted above, in some embodiments, the super chip is positioned above the WB but below at least some of the plain chips. The plain chips' low speed IOs are directly connected to the WB by long connections positioned side by side with the super chip; such connections may have to be longer than the super chip's thickness. The long connections can be bond wires (e.g. Bond Via Arrays (BVAs) described below) or solder stacks or Through Mold Vias (TMVs). The long connections are possibly low-speed and/or require a higher voltage or power, but the corresponding signals have low-speed and/or higher voltage or power requirements anyway and thus are consistent with the long connections. If such requirements allow these connections to be lengthened, then the super chip can be made thicker. For example, in some embodiments, a silicon super chip (i.e. based on a silicon substrate) has thickness of at least 300 microns, or at least 400 microns, or at least 500 microns, or at least 650 microns or at least 700 microns. In some embodiments, such a super chip has no TSVs and is manufactured as part of a commercially available standard-size, monocrystalline silicon wafer without thinning the wafer. Due to high thickness and elimination of the TSV and thinning process, the manufacturing yield is increased and the manufacturing cost is decreased. Semiconductor materials other than silicon can be used to provide the same or similar benefits.

Likewise, if the super chip overlies the plain chips, and the super chip's IOs directly connected to the WB are low-speed and/or high voltage or power, then their direct connections to the WB can be long, so the plain chips can be thick.

In some embodiments, some or all of the long connections are essentially vertical, i.e. each extends along a straight line perpendicular to the WB and/or the chips. However, the connection's thickness along its length can vary as typical for solder stacks for example. Non-vertical direct connections, e.g. inclined straight connections, can also be used. The connections can be non-straight, e.g. curved. Straight connections are shorter however, providing higher signal speeds.

In some embodiments, the lower chips—super chip or plain chips—are placed into a cavity in WB to shorten the WB connections of the upper chips.

The super chip can be any chip, e.g. one of chips 110F of FIG. 1. For example, in a system that has a controller communicating with sensors, databases, and possibly other devices, the controller chip can be a super chip connected to sensor chips, database storage-and-management chips, and the other devices' chips. Any of these chips can also be directly connected to a coarse WB. The chips' IOs are subdivided into low and high speed IOs. For example, the plain chips' high-speed IOs can be connected to the controller without using the WB, while their slow IOs can be connected to the WB. The controller may also have slow IOs (e.g. for power and ground) connected to the WB.

Further, some embodiments provide novel manufacturing methods for assembling an MCM. Rather than attaching each chip to a WB, in some embodiments, at least some of the chips are assembled together into a reconstituted wafer, i.e. a wafer assembled from the chips placed next to each other and fastened together by a molding compound. Additional chips can be attached to the reconstituted wafer. The reconstituted wafer with the additional chips can be diced into separate modules each of which can be attached to a WB. Then still other chips can be attached to the assembly if needed.

The invention is not limited to the features and advantages described above except as defined by the appended claims.

BRIEF DESCRIPTION OF THE DRAWINGS

FIGS. 2B and 2C are plan views of MCMs according to some embodiments of the present invention.

FIGS. 3A-1, 3A-2, 3B-1, 3B-2, 3C, 3D, 3E, 4A, 4B, 4C, 5, 6A show vertical cross sections of MCMs according to some embodiments of the present invention.

FIG. 6B is a plan view of an MCM according to some embodiments of the present invention.

FIGS. 6C, 7A, 7B-1 show vertical cross sections of MCMs according to some embodiments of the present invention.

FIG. 7B-2 is a plan view of an MCM according to some embodiments of the present invention.

FIGS. 8A, 8B, 8C, 8D, 9A, 9B, 9C, 9D, 9E, 10A, 10B, 11A, 11B, 11C, 12A, 12B, 12C, 12D show vertical cross sections of MCMs in the process of fabrication according to some embodiments of the present invention.

FIG. 16 is a block diagram of a system according to some embodiments of the present invention.

DESCRIPTION OF SOME EMBODIMENTS

The embodiments described in this section illustrate but do not limit the invention.

Figure 1:
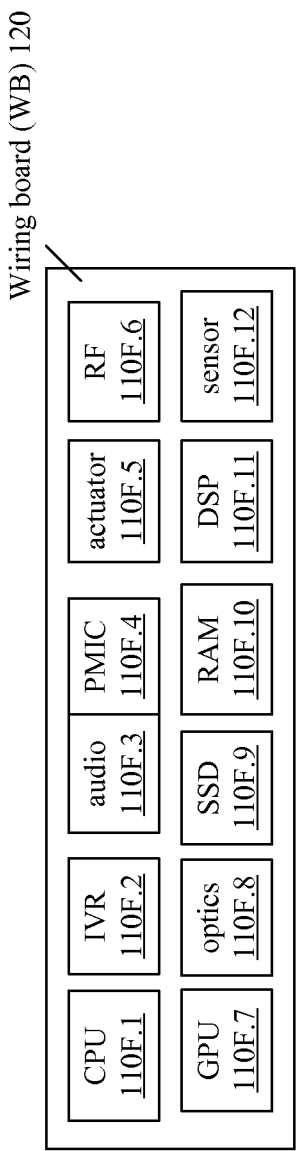
FIG. 1 is a top view of a multi-chip module (MCM) according to prior art.
Figure 2A:
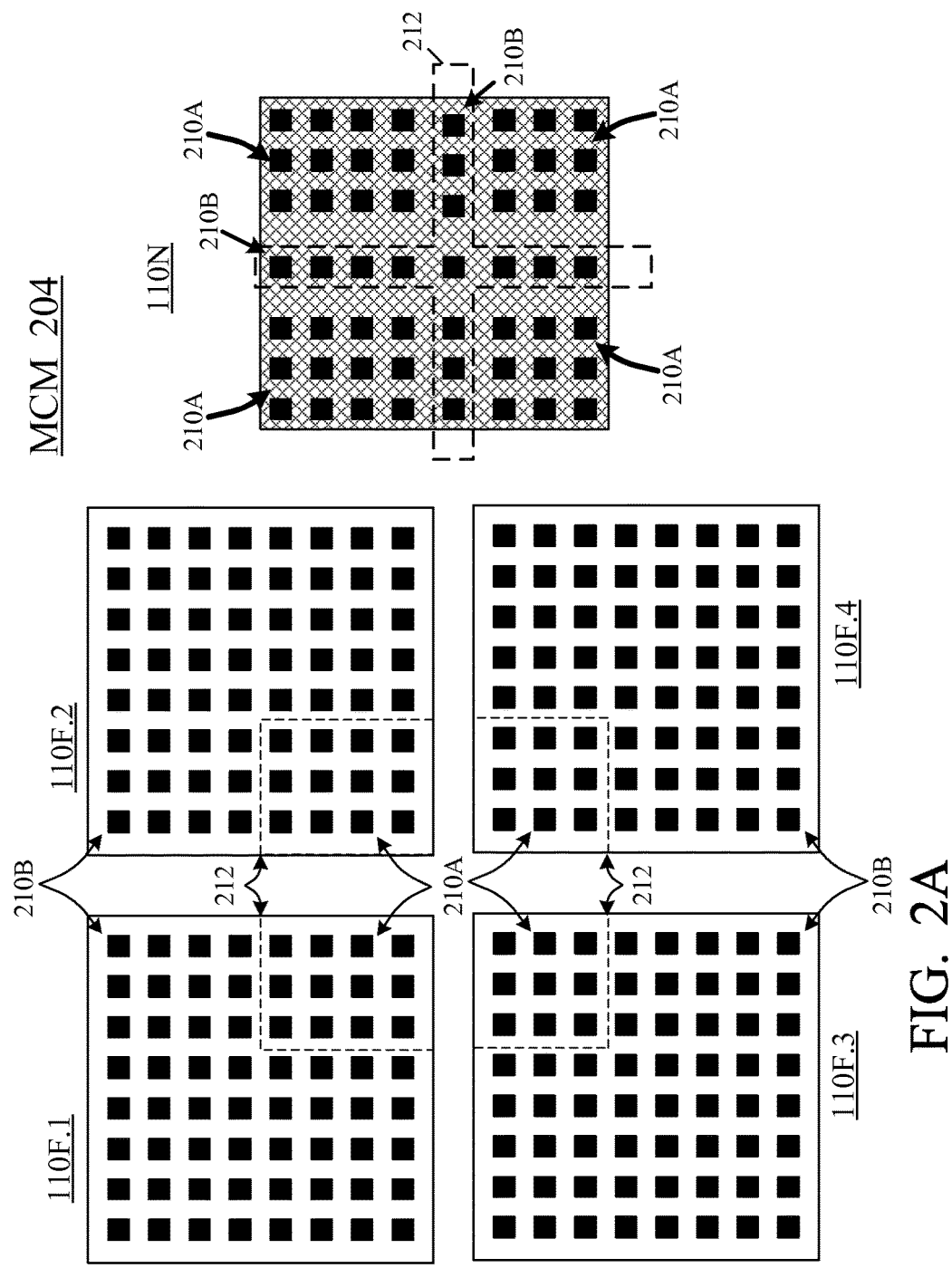
FIG. 2A is a plan view of chips in an MCM according to some embodiments of the present invention.
Figure 2B:
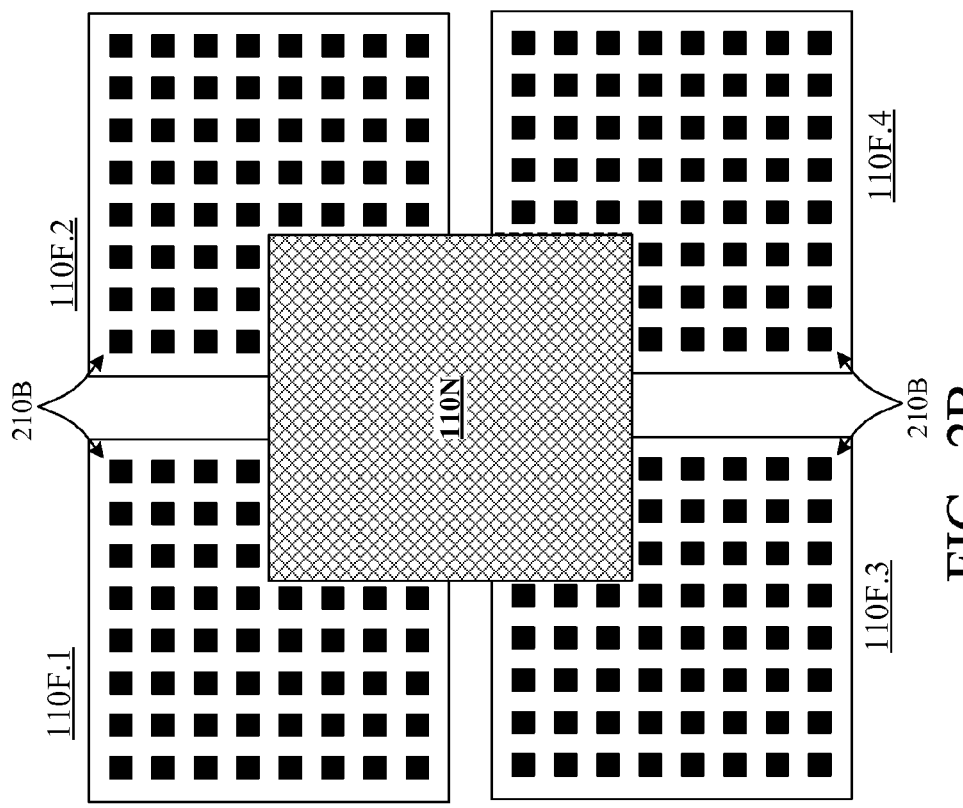

FIGS. 2A and 2B illustrate an exemplary multi-chip module (MCM) 204 with four plain chips 110F.1, 110F.2, 110F.3, 110F.4 interconnected by a super chip 110N. Plain chips 110F (i.e. 110F.1 through 110F.4) and super chip 110N can be any chips 110 shown in FIG. 1 or any other chips. In a non-limiting example, chip 110F.1 is a CPU (like 110F.1 in FIG. 1), chip 110F.2 is a GPU (like 110F.7 in FIG. 1), chip 110F.3 is a RANI (like 110F.10 in FIG. 1), and chip 110F.4 is a PMIC (like 110F.4 in FIG. 1). The plain chips' IOs 210 include high-speed IOs 210A and low-speed IOs 210B. We refer to high-speed IOs 210A as "group A", and to low-speed IOs 210B as "group B". Each group may include only one IO or multiple IOs.

Super chip 110N has IOs 210A attached to plain chips 110F, and IOs 210B in the middle that will be directly connected to a (possibly coarse) WB.

FIG. 2A illustrates each chip separately, in a plan view showing each chip's IOs 210; FIG. 2B illustrates the chips interconnected, with the super chip 110N being upside-down relative to the view of FIG. 2A. In FIG. 2A, dashed lines 212 mark the boundary between the chips' areas with IOs 210A and the chip areas with IOs 210B. In this example, some or all of the IOs 210A of each chip are high-speed (fast) IOs, and some or all of the IOs 210B are low-speed (slow). In each plain chip, IOs 210A are in the corners. In super chip 110N, IOs 210B are in the middle of the chip, and IOs 210A are in the corners.

In some embodiments, high-speed IOs 210A can be used to communicate between the plain chips through super chip 110N without using WB 120, while low-speed IOs can be used to communicate through the WB.

FIG. 2C is a plan view of another MCM with a super chip 110N connected to multiple plain chips 110F.1 through 110F.5. The IOs 210 are not shown. All the plain chips 110F have IOs 210A attached to super chip 110N. All the plain chips except 110F.4 have additional IOs 210B on the same side as the super chip; these IOs are directly connected to the WB (not shown).

Each chip 110 (110F and 110N) can be replaced by an MCM. Such an MCM may have multiple chips which together function as a super chip or a plain chip.

In some embodiments, a super chip 110N has IOs only on one side—the side facing the corresponding plain chips 110F, and the super chip has no through-substrate vias (TSVs). Likewise, a plain chip 110F may have IOs only on one side and may have no TSVs.

The IOs can have any structure, e.g. UBM (under-ball-metallurgy) or copper pillars, and can be made using standard BEOL (back end of the line) processes, but this is not limiting.

If a chip has no TSVs, it may be possible to make the chip thick, and then the chip can be manufactured at high yield, with no concern about warpage or other problems present in thin wafer handling.

In some embodiments, communications between low-speed IOs 210B do not require high speeds and are conducted through slower but possibly less-costly direct connections. Examples of such connections are wires or studs such as BVA (Bond Via Array); see Invensas™ High Performance BVA PoP package for Mobile Systems, May 2013 by Invensas Corporation of San Jose, Calif., incorporated herein by reference; see also U.S. Pat. No. 8,618,659 issued Dec. 31, 2013 to Sato et al., incorporated herein by reference; and U.S. pre-grant patent publication 2014/0036454 by Caskey et al., published Feb. 6, 2014, incorporated herein by reference. Other types of long direct connections can be solder stacks or solder lines. See for example E. Zakel et al., "High Speed Laser Solder Jetting Technology for Optoelectronics and MEMS Packaging", ICEP 2002, incorporated herein by reference. See also U.S. Pat. No. 6,455,785 issued Sep. 24, 2002 to Sakurai et al.; U.S. patent application Ser. Nos. 14/275,519 and 14/275,514, all incorporated herein by reference. Solder stacks can be quite tall as described in the two patent applications, and can be inexpensively formed by printing. Such long direct connections (BVAs or solder stacks) can be initially formed on either the WB or the chip or both. In particular, for some IOs 210B, the direct connections can be formed on the IOs, while for other IOs 210B the direct connections can be formed on the WB. For still other IOs 210B, part of a direct connection (e.g. part of a wire or a solder stack) can be formed on the IO and the other part on the WB; the two parts can be attached to each other by any suitable means (e.g. solder, adhesive, diffusion bonding, etc.) to form a complete long direct connection.

In some embodiments, some interconnection between the plain chips is provided by the super chip, and hence fewer interconnections are provided by the WB, so the WB size and cost can be reduced.

In some embodiments, the super chips have only interconnect lines. In other embodiments, the super chips have other circuitry, e.g. memory buffers, switches, parallel-to-serial and serial-to-parallel converters, and possibly other types.

The following benefits are obtained in some embodiments:

The super chip 110N may have no TSVs to enable large-scale multi-functional integration (of chips with different functions) at much higher yield and lower cost than an interposer with thru vias (TSVs).

High bandwidth, low power consumption, high yield, low cost.

Advantageous for multi-functional mobile MCM integrating optics, sensors and MEMS (micro-electro-mechanical systems).

Some features are as follows:

An MCM where one super chip is attached to multiple plain chips.

The IOs on each of the chip are subdivided into two groups A and B and spatially compartmentalized. Group A of each plain chip communicates with the group A of other plain chips (within the MCM) through the high-bandwidth (very fine pitch and high speed) interconnects on the super chip. Group B of each plain chip communicates with other devices through relatively lower-speed interconnects such as BVA or other type of wires, or solder stacks.

The IOs of some or all of the super and plain chips can be made by standard BEOL (Back End of the Line) methods on Si without the need for TSVs or for small thickness at very high yield and no concern about warpage or thin-wafer handling.

The super chip's IOs can be attached to the plain chips' IOs via metal pillars, microbumps, or metal-to-metal diffusion bonding, or by other attachments suitable for high speed interconnection. Such attachments can be more expensive than, say, solder, but higher attachment costs are tolerable in some embodiments.

Exemplary fabrication methods are described in more detail further below. Briefly, in some embodiments, the chips can be assembled together before attachment to the WB. For example:

1. Bond all the plain chips to one reconstituted wafer first. Then bond each of the super chips over a respective group of plain chips (process details are described below in connection with FIGS. 8A-8D). Here "reconstituted wafer" denotes a wafer made of multiple chips which may have been manufactured in other wafers: the chips are placed on a common substrate (possibly into a frame, possibly on an adhesive tape) and overmolded (i.e. encapsulated in a molding compound). Excess molding compound can then be trimmed/thinned as needed. The common substrate may or may not be removed before further processing (e.g. bonding of other chips to the wafer), possibly leaving the chips held together by the molding compound and possibly the adhesive tape (the adhesive tape may or may not be removed) and possibly the frame (if used and not removed); this structure is called reconstituted wafer. See e.g. Jeffrey Gotro, "Polymer Challenges in Electronic Packaging: Part 7—Embedded Wafer Level Packaging Process Flow", Polymer Innovation Blog (Practical tips and advice for polymer, innovation and product development professionals), Nov. 25, 2013, incorporated herein by reference, at http://polymerinnovation-blog.com/polymer-challenges-electronic-packaging-part-7-embedded-wafer-level-packaging-process-flow/. See also US pre-grant patent publications nos. 2014/0335654 (Jul. 8, 2014; inventors: Barth et al.) and 2012/0168943 (Jul. 5, 2012; Gan et al.), both incorporated herein by reference.

2. Alternatively, bond each plain chip onto the super chip one by one (process details are described below in connection with FIGS. 10A-10B), before attaching the chips to a WB.

In either type of fabrication, the long direct connection structures (e.g. pillars or discrete wires) can be formed on either the chips 110 or the WB 120 or both.

In some embodiments, the chips thermally connect to the WB via thermal interface material (TIM). TIM can be introduced through channels (through-holes) in the WB from the WB backside.

A WB 120 may have a cavity to accommodate the super chip and/or the plain chips.

Typically (but not necessarily) we use reference numeral "110N" for super chips, and "110F" for chips that either plain or neither plain nor super. As noted above, a chip can be both a plain chip and a super chip or can be neither.

Multiple MCMs can be provided each of which comprises a super chip 110N and multiple plain chips 110F, and such MCMs can be stacked or chained or otherwise combined into a scalable system (a larger MCM), with various types of interconnection between MCMs such as solder bumps, interposers, bond wires, etc. Some examples are described below in connection with FIGS. 7A, 7B-1, and 7B-2.

Figures 1, 7B:
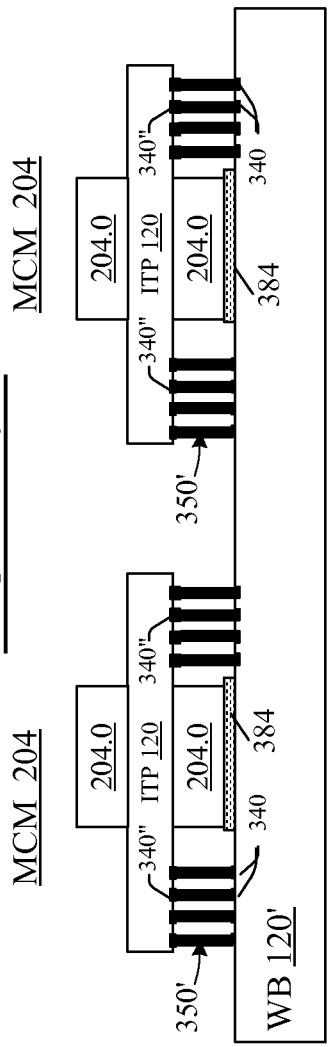
Figures 2, 7B:
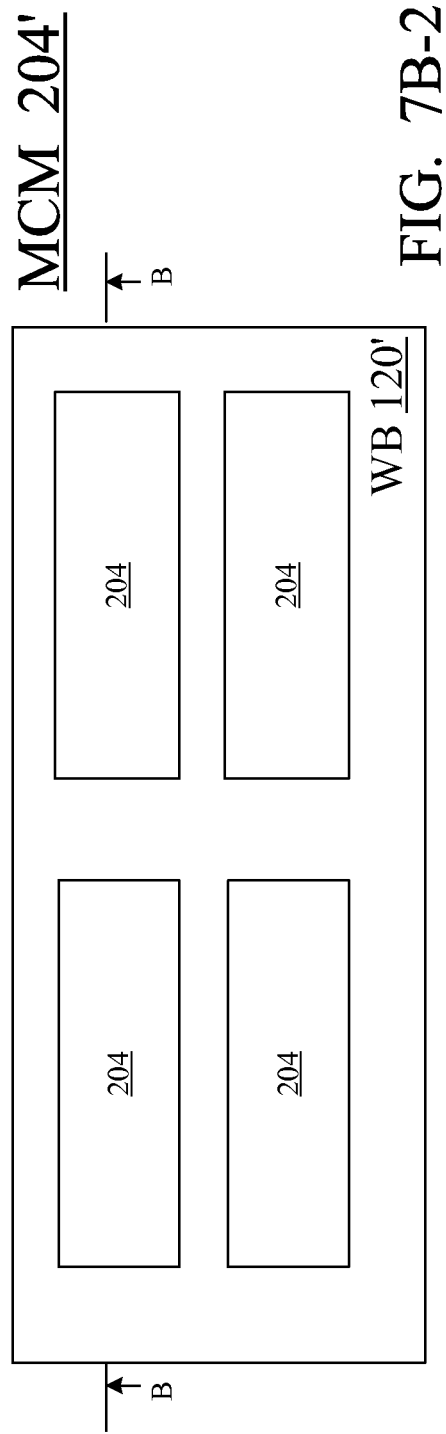

FIGS. 3A-1 and 3A-2 illustrate vertical cross sections of an MCM according to some embodiments; FIG. 3A-1 is an exploded view, and FIG. 3A-2 illustrates the assembled MCM. In these figures, two plain chips 110F.1, 110F.2 are attached to a super chip 110N to form a three-chip sub-module 204.0. The sub-module 204.0 can be fabricated separately before the attachment to the WB using techniques described above and below. In other embodiments, the sub-module is not separately fabricated; e.g. super chip 110N can be attached to the WB first, and plain chips 110F.1 and 110F.2 can be placed and attached on top. (Even though the super chip can be attached to the WB, e.g. by organic polymeric adhesive, this is not shown in these figures, and in fact in some embodiments the super chip is not attached to the WB.)

There may be other plain chips attached to super chip 110N outside of the cross section of FIGS. 3A-1 and 3A-2.

Some or all of chips 110F and 110N have the structure of a chip 110 shown in insert A of FIG. 3A-2. This chip has a semiconductor substrate 320 and additional layers 330 formed on substrate 320. IOs 210 (including 210A and 210B if present) can be part of layers 330. The top side, i.e. the side with layers 330, can be the active side, i.e. there may be transistors, capacitors, inductors, resistors, diodes, and other elements at that side. However, such circuit elements can be formed in the middle of substrate 320 and/or below the substrate, with through-substrate vias (TSVs, not shown) used to interconnect the circuit elements at the top and bottom of the chip. In particular, in the figures, the side with contact pads 210 can be the active side in each chip, but can also be the opposite side (e.g. if the IOs 210 are connected to the circuit elements at the active side by means of TSVs).

In FIGS. 3A-1 and 3A-2, super chip 110N has IOs 210A on top, on the side facing away from the WB. Super chip 110N does not have IOs 210B (i.e. has no IOs directly connected to the WB). IOs 210A of super chip 110N are attached to IOs 210A of plain chips 110F (i.e. 110F.1 and 110F.2). The plain chips 110F are side by side, and each of them overlaps the super chip 110N and extends laterally beyond the super chip. All the IOs 210 of plain chips 110F are on the bottom side; IOs 210A are attached to IOs 210A of super chip 110N by solder, conductive or anisotropic adhesive, diffusion bonding, or other techniques. The attachments are schematically shown at 334, and we will refer to them as attachments 334 as if they were separate elements but in case of diffusion bonding there are no separate elements in the attachments. Different attachments 334 can be of the same or different types in the same MCM.

WB 120 includes contact pads 340 interconnected by conductive lines 344. Long direct connections 350 are formed on contact pads 340. The top ends of connections 350 are attached to IOs 210B of plain chips 110F. The attachment can be by solder or other techniques described above for attachments 334. A long connection 350 can be a bond wire (e.g. BVAs made of copper or other materials described above), or a wire formed photolithographically by patterning a hole in photoresist (not shown) and filling the hole by a conductor (e.g. copper or other metal); see U.S. patent application Ser. No. 14/250,317, filed 10 Apr. 2014 (first named inventor: Cyprian Uzoh), entitled, "Die Stacks with One or More Bond Via Arrays", incorporated herein by reference. A connection 350 can also be a solder ball or a solder line or a stack of solder balls as described above—solders have lower melting temperatures, say 450° C. or below, than copper or other materials that can be used in the wires described above, but the wires can be made of low melting temperature materials too. Different connections 350 can be of the same or different types. Clearly, each connection 350 is longer than the thickness of super chip 110N.

In some embodiments, for some or all of the connections 350, each connection 350 is essentially vertical, i.e. extends along a straight line perpendicular to the WB and/or the bottom surfaces of chips 110F. However, the connection's thickness can vary as typical for solder stacks for example. Non-vertical connections, e.g. inclined straight connections, can also be used. The connections can be non-straight, e.g. curved.

As seen in FIG. 3A-1, in some embodiments, the base portions of connections 350 are encapsulated by molding compound 360 (e.g. dielectric organic polymer, such as epoxy, possibly with fillers). The top ends of connections 350 protrude out of encapsulant 360. To limit the encapsulant 360 to a height that does not cover the top ends of connections 350, the encapsulant can be formed by a film assisted molding process in which the tops of connections 350 pierce a film provided in the mold tool's cavity—see U.S. pre-grant patent publication no. 2014/0220744 (Aug. 7, 2014; inventors: Damberg et al.), incorporated herein by reference. However, other techniques can be used, e.g. encapsulating the entire wires 350 and then exposing the wires by removal of the top portion of the encapsulant. The removal can be by a chemical etch, particle blasting, laser ablation, or possibly other methods.

Super chip 110N can be thick if the connections 350 are long. Exemplary height of BVA connections 350 is in the range of 0.1 mm to 1 mm, but greater or lower heights are also possible.

Additional molding compound (e.g. underfill, not shown) can be introduced to encapsulate the top ends of connections 350, possibly after the attachment to plain chips 110F. Further, adhesive (not shown, possibly organic polymeric resin with or without fillers) can be present under super chip 110N to glue the super chip to WB 120. Additional underfill (not shown) can be used between plain chips 110F and super chip 110N to encapsulate the attachments 334.

FIG. 3B-1 (exploded view, vertical cross section) and 3B-2 (non-exploded view, vertical cross section) show a similar structure. However, the connections 350 are initially formed on plain chips 110F (on IOs 210B) rather than on the WB.

In FIGS. 3B-1 and 3B-2, the encapsulant 360 is also initially formed on plain chips 110F, but this is not necessary. For example, the encapsulant can be provided after attachment of the chips 110 to the wiring board.

As shown in FIG. 3B-2, connections 350 formed on plain chips 110F are attached to the WB contact pads 340 by attachment features 364. Attachments 364 can be of any type described above for attachments 334 and 350 (solder, diffusion bonding, etc.). Underfill 368 encapsulates these attachments and fills the space between the encapsulant 360 and the WB. If desired, UF 368 and encapsulant 360 can be formed simultaneously during or after joining of chips 110 to the WB. A direct connection 350 with its corresponding attachment 364 can be viewed as a single long direct connection. A typical connection 350 in this or other embodiments described in this disclosure may include an attachment(s) such as 364 at either end and/or in the middle (as when part of connection 350 is made on the WB and another part on the chip and the two chips are joined by an attachment such as 364). Thus, a direct connection 350 may consist of different types of direct connection segments.

Also shown is underfill 380 between the super chip 110N and the plain chips 110F. Underfills 368 and 380 can be capillary or no-flow type, and can be molding compounds, or non-conductive paste or tape, or any other type known in the art or to be invented. A typical underfill is a dielectric organic polymeric material, possibly cured resin, possibly with fillers, as known in the art; the underfills may or may not be the same material as encapsulant 360.

WB 120 may include channels (through-holes) filled with thermal interface material (TIM) 384, e.g. thermal grease, or metal paste (e.g. copper), or some other type. TIM 384 may also fill the space between the super chip 110N and the WB. TIM 384 has a higher thermal conductivity than super chip 110N and/or the rest of the WB and/or the WB substrate (i.e. the WB portion other than the conductive lines 344 and contact pads 340; this portion supports the lines 344 and contact pads 340) and/or the ambient and/or the surfaces in physical contact with the TIM. If needed, dielectric is provided around the TIM to electrically insulate the TIM from other parts of the structure. For example, if the TIM is conductive copper paste, the dielectric may be provided on the WB surface and the surface of super chip 110N if such surfaces are not dielectric and are in physical contact with the TIM. The TIM may glue the super chip 110N to WB 120. WB lines 344 may be routed around the TIM as needed. The TIM can also be provided in the embodiments discussed above in connection with FIGS. 3A-1 and 3A-2, and may have the same geometry (e.g. the same channel positions and dimensions).

Figure 3C:
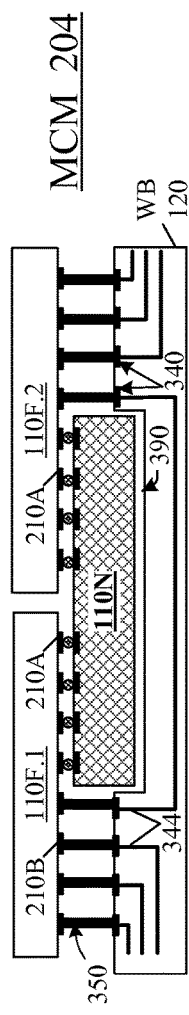

FIG. 3C is similar to FIG. 3A-2, but the bottom part of super chip 110N is in a cavity 390 in WB 120 (the cavity is in the WB substrate). In some embodiments, entire super chip 110N can be in the cavity. Connections 350 are reduced in height, which may improve electrical performance, e.g. speed up the signal propagation at IOs 210B and/or reduce the signal voltage requirements. This also reduces the vertical size of the structure, and may allow a greater choice of connections 350; for example, a single solder ball can be used for each attachment. Underfills and encapsulants are not shown and can be absent or can be used as desired, e.g. as in the embodiments described above. Vice versa, cavity 390 can be provided in the embodiments of FIGS. 3A and 3B (i.e. 3A-1, 3A-2, 3B-1, 3B-2).

Advantageously, in some embodiments, all the chips 110 have IOs on only one side (top or bottom), and include no TSVs.

Figure 3D:
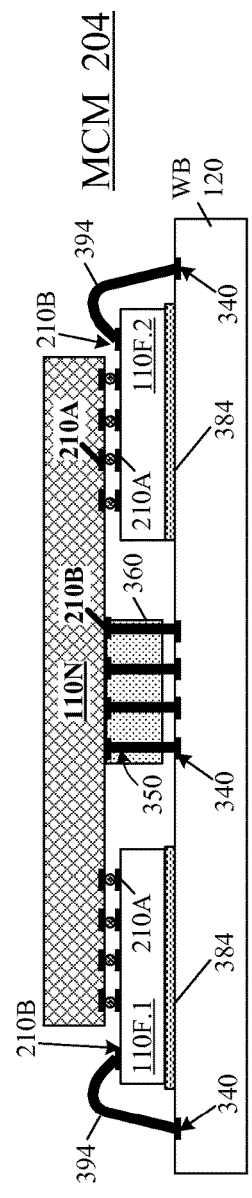

In FIG. 3D, plain chips 110F (110F.1, 110F.2, and possibly other such chips) are placed below the super chip 110N and above the WB (the WB can be as in the preceding embodiments; its interconnects 344 are not shown for simplicity). Plain chips 110F have their IOs 210 on top, while in super chip 110N the IOs 210 are on the bottom. IOs 210A of plain chips 110F are attached to IOs 210A of super chip 110N. IOs 210B of plain chips 110F are connected to the WB contact pads 340 by discreet bond wires 394. IOs 210B of super chip 110N are directly connected to the WB by long direct connections 350 which can be of any kind described above, e.g. BVAs. These connections 350 can originally be formed on super chip 110N or on the WB or both, and can be encapsulated by encapsulant 360 (e.g. a molding compound) if desired. They are positioned laterally between plain chips 110F (to the right of chip 110F.1 and to the left of chip 110F.2), and/or they can be at any other place.

Plain chips 110F are attached to the WB by an adhesive 384, possibly highly thermally conductive (possibly TIM, more thermally conductive than the WB and/or the plain chips and/or the ambient).

If connections 350 are long, plain chips 110F can be thick.

Figure 3E:
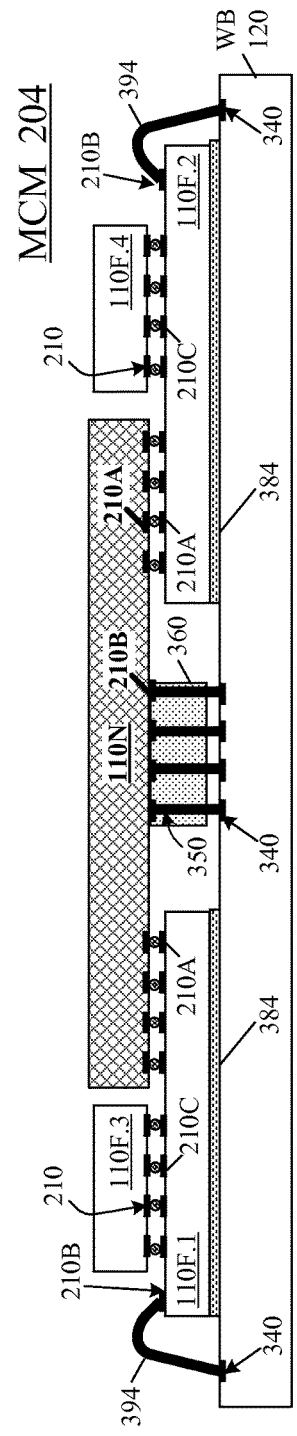

FIG. 3E is similar to 3D, but has additional chips 110F.3 and 110F.4 on top of respective chips 110F.1 and 110F.2. Plain chips 110F.1 and 110F.2 are as in FIG. 3D, but have additional IOs 210C on top that are attached to IOs 210 of respective chips 110F.3, 110F.4. In some embodiments, no TSVs are used, and all the IOs (contact pads) 210 are on only one side of each chip.

FIGS. 4A, 4B, 4C show another MCM at different stages of fabrication. As shown in FIG. 4C, the MCM has four levels (four floors) of dies 110 above the WB 120: the first floor with super chip 110N, the second floor with plain chips 110F.1 and 110F.2, the third floor with chips 110F.3 and 110F.4, and the fourth floor with chips 110F.5 and 110F.6. There can be any number of floors, any number of chips in each floor, and the fabrication processes can be similar to those for other embodiments described above. The MCM of FIG. 4C includes two chip stacks attached to super chip 110N: the stack of chips 110F.1, 110F.3, 110F.5; and the stack of chips 110F.2, 110F.4, 110F.6. There may be any number of chip stacks, with the same or different numbers of chips in each stack. In the MCM of FIG. 4C, super chip 110N is below the chips 110F (as in FIGS. 3A-2 and 3B-2), but the super chip 110N could be above the chips 110F, and further there could be any number of super chips, with each super chip being attached to multiple other chips.

In some embodiments, the structure of FIG. 4A is fabricated first, then is processed to get the structure of FIG. 4B, which is then processed to get to FIG. 4C. The structure of FIG. 4A has the first two levels of chips 110. Super chip 110N is glued to WB 120 by adhesive 384. Plain chips 110F.1 and 110F.2 are arranged as in FIG. 3A-2. In super chip 110N, all the IOs are on top, and there are no IOs directly connected to the WB, and possibly no TSVs. The super chip's IOs 210A are attached to IOs 210A at the bottom of chips 110F.1 and 110F.2 (this is similar to FIG. 3A-2). The attachments can be as described above for attachments 334. IOs 210C of super chip 110N are connected to IOs 210.T at the top of chips 110F.1 and 110F.2 by bond wires 394. Chips 110F.1 and 110F.2 have additional IOs 210.T on top, for subsequent direct connection to the next floor chips 110F.3 and 110F.4 (FIG. 4B). IOs 210.T can be formed in any desired manner. For example, chips 110F.1 and 110F.2 may have the structure shown in Insert A of FIG. 3A-2; the layers 330 can be at the top or the bottom of each chip, or such layers can be present both at the top and the bottom. For example, contact pads 210.T can be part of a redistribution layer (RDL) forming a whole or a part of top layers 330. Substrate 320S may include through-substrate vias (TSVs) to connect the chip's contact pads 210.T to the chip's bottom contact pads 210A and/or 210B (contact pads 210B are directly connected to the WB by long direct connections 350 as in FIG. 3A-2). An exemplary chip architecture suitable for chips 110F is described below in connection with FIG. 5, Insert B.

The structure of FIG. 4A can be formed as described below in connection with FIGS. 8A-10B or in some other way.

Then third-floor chips 110F.3 and 110F.4 (FIG. 4B) are attached to the second floor chips 110F.1 and 110F.2. More particularly, the bottom IOs 210.B of chips 110F.3 and 110F.4 are attached to top IOs 210.T of respective second-floor chips 110F.1 and 110F.2. The attachments can be as described above for attachments 334. Third-floor chips 110F.3 and 110F.4 have IOs 210.T at the top. The IOs of chips 110F.3 and 110F.4 can be formed using the same techniques as for chips 110F.1 and 110F.2. In addition, third-floor chip 110F.3 has a top IO 210.T connected to a top IO 210.T of second-floor chip 110F.1 by a discrete wire 394; another IO 210.T of chip 110F.1 is connected to a top IO 210C of super chip 110N by another discrete wire 394. Thus, chip 110F.1 has two IOs 210T are attached to discrete wires 394; these two IOs 210.T may or may not be interconnected within chip 110F.1; also the two IOs 210.T can be replaced by a single IO connected to both wires 394. Such chains of discrete wires can interconnect the chips on any floors and/or WB.

Then fourth-floor chips 110F.5, 110F.6 (FIG. 4C) are attached to the third floor chips 110F.3 and 110F.4. More particularly, the bottom IOs 210.B of chips 110F.5 and 110F.6 are attached to top IOs 210.T of respective third-floor chips 110F.3 and 110F.4. The attachments can be as described above for attachments 334. In addition, fourth floor chip 110F.6 has a top IO 210.T connected to a top IO 210.T of third-floor chip 110F.4 by a discrete wire 394. Such discrete wires may connect the top IOs of any chips on any floors to each other and/or the WB.

FIG. 5 shows a structure similar to FIG. 4C, with the super chip 110N having TSVs and contact pads on top and bottom. Any chip 110 (110F or 110N) may have such a structure, i.e. may be made of semiconductor (possibly silicon), ceramic, glass, organic, and/or composite materials, and/or other materials, and have TSVs. An exemplary chip 110 (110N or 110F) with TSVs 510 is shown in insert B in FIG. 5. The chip is like in insert A of FIG. 3A-2, but includes TSVs 510 passing through the semiconductor or other substrate 320 and providing the bottom contact pads 210 (the chip can also be upside down; the chip orientation in insert A or B does not necessarily represent the chip orientation in the rest of the drawings). The tops of TSVs 510 in Insert B are connected to the top IOs 210 by circuitry (not shown) in layers 330. If substrate 320 is not dielectric, a dielectric can be present to insulate the substrate 320 from vias 510. In Insert B, the TSVs' bottom ends provide IOs 210. In some other embodiments, the TSVs' bottom ends do not provide IOs, and there are additional layers on the bottom (similar to layers 330 on the top) providing the bottom IOs 210 and connecting the bottom IOs to the TSVs' bottom ends. Other chip/interposer structures can also be used; for example the TSVs could be either vertical as in Insert B or non-vertical, e.g. can be zigzag as common in interposers based on laminated substrates. Layers 330 can be absent.

The bottom IOs 210B of super chip 110N are attached to the WB's contact pads 340; the attachments 520 could be of any type described above for attachments 334 (solder, diffusion bonding, etc.).

Long connections 350 are at least as long as the combined height of super chip 110N and attachments 520. In some embodiments, a cavity can be formed in WB 120 similar to cavity 390 of FIG. 3C, to shorten the connections 350. Similar cavities can be used in other embodiments described herein.

WB 120 can have chips and MCMs on both the top and bottom sides. One example is shown in FIGS. 6A and 6B, where the WB 120 is an interposer ("ITP"). FIG. 6B is the top view, and FIG. 6A shows a vertical cross section along the line A-A in FIG. 6B. In this particular example, there is just one MCM 204.0 attached to the top side of ITP 120, and just one MCM 204.0 attached to the bottom side, and both MCMs are as in FIG. 3A-2. However, there can be any number of chips or MCMs attached to the top and bottom sides, not necessarily of the same kind; for example, in FIG. 6C (vertical cross section), top MCM 204.0 is as in FIG. 3D (discrete wires 394 are absent but could be present as in FIG. 3D), and the bottom MCM 204.0 is as in FIG. 6A. In other examples, multiple MCMs can be present on top and bottom of the same or different kinds, e.g. some MCMs can be as in FIG. 3A-2 and some other MCMs can be as in FIG. 4C or of some other kind.

In FIGS. 6A-6C, ITP 120 has TSVs 510 and top and bottom contact pads 340' and 340". Contact pads 340' are attached to MCMs 204.0 (e.g. IOs 210B) on top and bottom. Contact pads 340" can be attached to other circuit elements as exemplified below. The ITP's TSVs 510 and possibly other conductive lines (not shown, e.g. RDLs on top and/or bottom) interconnect the ITP's top and bottom contact pads 340 (i.e. 340' and 340") in a desired pattern so as to interconnect the top MCMs or chips and the bottom MCMs or chips as needed. The ITP 120 may have any structure, e.g. as described above in connection with Insert B of FIG. 5 or some other interposer structure. In particular, ITP 120 can be based on semiconductor, glass, organic, ceramic, or other kind of substrate, and may or may not be coarse.

FIG. 7A illustrates possible interconnection of different MCMs using the contact pads 340"; contact pads 340" can be as in FIGS. 6A-6C or can be any other MCM contact pads available for attachment to other MCMs. In FIG. 7A, four MCMs 204 of the type shown in FIG. 6A-6B or 6C are serially attached to each other; contact pads 340" of each MCM 204 are attached to contact pads 340" of adjacent MCM(s) 204. Each MCM 204 may have additional contact pads 340" directly connected to other circuits, possibly by bond wires 394. One or more of MCMs 204 may have other architectures than shown in FIGS. 6A-6C.

In another example (FIG. 7B.1 showing a vertical cross section along the line B-B of the top view FIG. 7B.2), contact pads 340" of different MCMs 204 are directly connected to contact pads 340 of another wiring board 120' by long connections 350' (e.g. BVAs or solder stacks or some other kind described above). WB 120' has conductive lines (not shown, like 344 in FIG. 3B-2) which interconnect the WB's contact pads 340 in a desired pattern. In the example of FIG. 7B.2, four MCMs 204 are attached to the top side of WB 120', but any number of MCMs 204 can be attached to the top and bottom sides of WB 120'. The combined MCM is marked 204'. Such MCMs 204' can be further interconnected using techniques described above, i.e. the contact pads 340 of ITPs or WBs 120 and 120' of different modules 204, 204' can be attached to each other as desired. Adhesive 384 is shown in FIG. 7B-1 as attaching the bottom sub-modules 204.0 of MCMs 204 to WB 120' but no adhesive is used in some embodiments. Encapsulants and underfills are not shown but may be present.

WB 120' may have other contact pads 340 (not shown) attached to bond wires or other discrete circuit elements.

FIGS. 8A-8D show an exemplary MCM manufacturing process. In the example shown, the MCM is as in FIG. 3A-2, but such manufacturing processes can be used for other MCMs described above and still other MCMs.

As shown in FIG. 8A, chips 110F.1 and 110F.2 are joined by molding compound 820 to form a reconstituted wafer 810. See for example the aforementioned publication by Jeffrey Gotro, "Polymer Challenges in Electronic Packaging: Part 7—Embedded Wafer Level Packaging Process Flow", Polymer Innovation Blog (Practical tips and advice for polymer, innovation and product development professionals), Nov. 25, 2013, incorporated herein by reference, at http://polymerinnovationblog.com/polymer-challenges-electronic-packaging-part-7-embedded-wafer-level-packaging-process-flow/. See also the aforementioned US pre-grant patent publication no. 2014/0335654 (Jul. 8, 2014; inventors: Barth et al.) and 2012/0168943 (Jul. 5, 2012; Gan et al.), both incorporated herein by reference. Molding compound 820 can be dielectric, and can be epoxy-based or some other organic polymeric material, e.g. a resin with organic or inorganic additives, possibly organic or inorganic hard-particle fillers, or some other material. To form reconstituted wafer 810, the chips 110F are placed on a common substrate or frame (not shown), possibly on an adhesive tape (not shown); and then viscous or liquid molding compound 820 is deposited over the chips and is then cured. Excess molding compound 820 is removed by polishing or other means if needed to expose the contact pads 210 or for any other purpose.

Reconstituted wafer 810 may include more than two chips 110F, e.g. four chips 110F in the embodiment of FIG. 2B. For the MCM of FIG. 4C, wafer 810 may include just the second level chips 110F.1 and 110F.2, or just the third level chips 110F.3 and 110F.4, or just the fourth level chips 110F.5 and 110F.6. Wafer 810 may include chips 110F of different thicknesses and/or may include chips positioned at different heights. As noted above, a plain chip 110F may be replaced by an MCM; for example, in the case of FIG. 7B-2, all the four MCMs 204 can be separately manufactured and placed in a single reconstituted wafer 810 before attachment to WB 120' and possibly to other components.

If needed, suitable connection structures 334 (e.g. solder bumps, UBM, copper pillars, etc.) are made on some or all IOs 210 of chips 110F that are part of reconstituted wafer 810. Some or all of such structures (e.g. copper pillars or UBM) can be formed before the chips are placed in the reconstituted wafer. If desired, other circuitry (e.g. RDL, not shown) can be formed on wafer 810. In FIG. 8A, all the IOs are provided by chips 110F, but some or all of the IOs 210 can be provided by such additional circuitry (e.g. RDL); such circuitry can also connect its IOs 210 to the chips' IOs.

Wafer 810 may include just one chip 110F, or just one MCM.

When the reconstituted wafer 810 has been formed, other chips or MCMs are attached to wafer 810. In the example of FIG. 8B, super chip 110N is attached, with its IOs 210A being attached to the reconstituted wafer's IOs 210A, i.e. to IOs 210A of chips 110F.1 and 110F.2 in the example shown. Multiple floors of chips or MCMs can be attached to the top and/or bottom side of reconstituted wafer 810. For example, for the module of FIG. 4C, the reconstituted wafer may be formed with chips 110F.3 and 110F.4, and then the chips 110F.5 and 110F.6 can be attached to the wafer's top side, and the chips 110F.1, 110F.2 and 110N can be attached to the bottom side. In some embodiments, the chips are attached only to the top side to simplify manufacturing; for example, for FIG. 4C, the reconstituted wafer may include only the chips 110F.5 and 110F.6, and all the other chips 110F and 110N are attached to only the bottom side of the wafer.

Underfills and encapsulants are deposited as needed (FIG. 8B shows UF 380 between the super chip 110N and the chips 110F).

A reconstituted wafer may include chips of multiple MCM structures, and can be diced at any stage. For example, if multiple MCMs 204 of FIG. 3A-2 are being fabricated, then at the stage of FIG. 8A the reconstituted wafer may include the chips 110F.1 and 110F.2 of each MCM 204. The modules or sub-modules can be separated from the reconstituted wafer at any stage, e.g. after the stage of FIG. 8D or at an earlier fabrication stage, with subsequent fabrication stages being performed on separate dies.

For example, the sub-modules can be separated after the stage of FIG. 8B (by dicing the reconstituted wafer or by other techniques, e.g. as in the aforementioned U.S. Pat. No. 8,772,087) to separate the sub-modules 204.0 from each other.

The WB component is separately manufactured as needed, and one example is shown in FIG. 8C: here, BVAs or other long connections 350 are formed on the WB's contact pads 340; the bottom portions of structures 350 are encapsulated by molding compound 360 (formed using film assist molding or some other process). Connections 350 protrude above the molding compound. Solder stacks and/or other types of direct connections can be used, with or without a molding compound. In some embodiments, no connection structures are used other than the WB's contact pads 340 themselves.

Then (FIG. 8D) the structure of FIG. 8B is attached to the structure of FIG. 8C: the IOs 210B of sub-module 204.0 are directly connected to the respective contact pads 340 via connections 350. Molding compound 820 can then be removed or further trimmed if desired.

Repeated application of reconstituted wafer techniques can be used to form complex MCMs. For example, for MCM 204' of FIGS. 7B-1 and 7B-2, each sub-module 204.0 can be formed using reconstituted wafer techniques described above. Then each module 204 can be formed, with or without use of reconstituted wafers, but without long connections 350'. Then the four MCMs 204 can be placed in a reconstituted wafer, and then wires or solder stacks 350' can be formed on the contact pads 340", and the reconstituted wafer can be attached to WB 120'. Other variations are possible.

Reconstituted-wafer-type techniques described above can be used to simplify stacking of MCMs on top of each other. One example is illustrated in FIGS. 9A-9E. FIG. 9A is similar to 8A: plain chips 110F.1 and 110F.2, and possibly additional chips, are joined by molding compound 820 in a reconstituted wafer. As noted above, chips' IOs can be redistributed by an RDL, and in FIG. 9A the plain chips have IOs 210X which will be connected to other IOs through an RDL 890 (FIG. 9B). Plain chips 110F also have IOs 210A that will be attached to a super chip 110N (FIG. 9C). Layer 820 may have a planar top surface, which may be coplanar or higher or lower than the top surface of any plain chip 110F. The plain chips' top surfaces may or may not be coplanar.

RDL 890 (FIG. 9B) is formed on the bottom side of reconstituted wafer 810 (the terms "bottom" and "top" refer to the structures as shown in the drawings and not necessarily to the actual orientation during manufacturing or use of the structures). The RDL's circuitry includes IOs 210Y.B on the bottom and IOS 210Y.T on top of the RDL (in physical contact with molding compound 820), and includes conductive lines 890L interconnecting the IOs 210X, 210Y.T, and 210Y.B as desired. In this embodiment, RDL 890 does not cover the contact pads 210A which remain exposed for attachment to a super chip(s) 110N (FIG. 9D). In other embodiments, one or more of IOs 210A are connected to the RDL's IOs 210Y (i.e. 210Y.T and/or 210Y.B). In this description, any IOs 210 may or may not be fast or slow, and may or may not be connected to a super chip or a plain chip, except as noted otherwise.

As shown in FIG. 9C, conductive through-mold vias (TMVs) 894 are formed in molding compound 820 to reach IOs 210Y.T. The TMVs may or may not be formed by known processes, such as described for example in U.S. Pat. No. 8,822,281 issued Sep. 2, 2014 to Pagaila et al. and incorporated herein by reference. Other processes can also be used. For example, in some embodiments, in order to form the TMVs, through-holes are formed in molding compound 820 over IOs 210Y.T, by mechanical or laser drilling or photolithographic patterning of molding compound 820 with or without a mask or perhaps by some other process. The holes can be vertical, with vertical or sloped sidewalls, but the holes can also be inclined. Then a conductor 894, e.g. metal, is deposited into the holes, by electroplating or electroless plating or ink-jet printing or stencil printing or solder waving or some other process. The top ends of TMVs 894 can be used as IOs attachable to other circuit elements such as chips, MCMs, or discrete circuit elements; these IOs are schematically shown as 894C. Alternatively, one or more additional layers (not shown), including conductive layers, can be deposited on top to provide one or more IOs 894C and interconnects (not shown) connecting the IOs 894C to the top ends of TMVs 894. Such additional layers may form an RDL. In some embodiments, the TMVs 894 protrude above the molding compound 820. For example, the conductor 894 can be deposited into the holes so as not to protrude above the molding compound, but molding compound 820 can then be recessed (e.g. etched) to form the TMV 894 protrusions. In other embodiments, the TMV protrusions are formed during deposition of conductor 894, by any of the processes described above; the deposition is performed long enough to form the protrusions. In some other embodiments, TMVs 894 do not protrude but are level with the top surface of molding compound layer 820 or are recessed below the top surface.

Turning to FIG. 9D, one or more super chips 110N are attached to the structure; top IOs 210A of super chips 110N are attached to bottom IOs 210A of plain chips 110F. The attachments are shown at 334, and can be by solder, diffusion bonding, conductive or anisotropic adhesive (possibly organic polymeric) or possibly other types.

Then (FIG. 9E) dielectric underfill/encapsulant 898 is formed on the bottom of the structure, e.g. by spin-on or molding or some other process, to encapsulate the attachments 334 and cover the bottom surface of RDL 890. Layer 898 can be a dielectric molding compound, possibly organic polymeric resin with fillers. Layer 898 may or may not have a planar bottom surface, which can be above or below or coplanar with the bottom surface of any one or more of super chips 110N. In some embodiments, the bottom surface of encapsulant 898 is below the bottom surfaces of all the super chips.

TMVs 902 are formed in molding compound 898 to terminate on bottom contact pads 210Y.B. TMVs 902 can be formed by any of the techniques described above for TMVs 894. The bottom ends of TMVs 902 may be recessed into encapsulant 898, or coplanar with the encapsulant's bottom surface, or protrude out of the encapsulant's bottom surface. The bottom ends are IOs attachable to other circuits; the IOs are schematically shown as 902C. Alternatively, one or more additional layers (not shown), including conductive layers, can be deposited on the bottom to provide one or more IOs 902C and interconnects (not shown) connecting the IOs 902C to the bottom ends of TMVs 902. Such additional layers may form an RDL.

Other MCMs or chips or discrete circuits can be attached to IOs 894C, 902C to form stacked modules. For example, the MCMs of the type of FIG. 9E can be conveniently stacked above each other and attached to each other at their IOs 894C, 902C. Any number of such structures can be so stacked; high scalability is therefore provided.

Figure 10A:
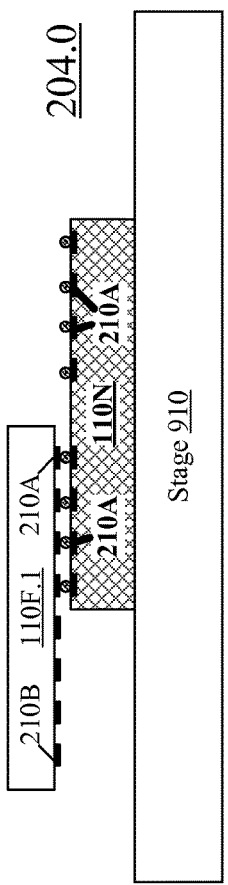
Figure 10B:
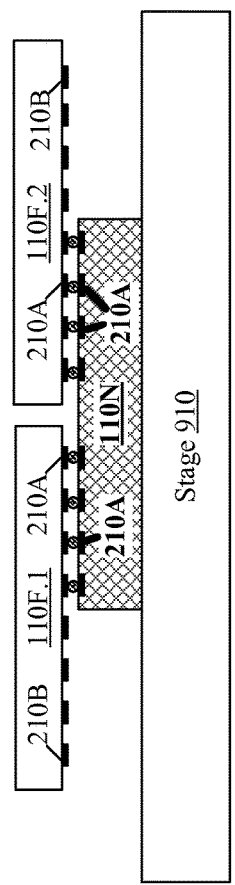

FIGS. 10A and 10B show another exemplary manufacturing process. In the example shown, the process forms an MCM 204 similar to that of FIG. 3B-2, but such processes can be used for other MCMs described above and perhaps still other MCMs. This process separately manufactures a sub-assembly 204.0 without using a reconstituted wafer.

More particularly, as shown in FIGS. 10A and 10B, super chip 110N is placed on vacuum stage 910 which holds the chip by vacuum. The super chip's IOs 210 are on top. The vacuum stage is heated to a temperature needed to attach IOs 210A of plain chips 110F to IOs 210A of super chip 110N. The attachment can be by solder, diffusion bonding, conductive or anisotropic adhesive, or some other technique as described above for the attachments 334. The attachment uses heat from stage 910. The attachment can be one chip 110F at a time or multiple chips 110F simultaneously. Multiple floors of chips can be attached (e.g. for the module of FIG. 4C).

One advantage of this scheme over the reconstituted-wafer approach of FIGS. 8A-9E is simpler alignment between the plain chips 110F and the super chip 110N. More particularly, in the reconstituted-wafer processes of FIGS. 8A-9E, the plain chips are fastened to each other before attachment to the super chip, so the plain chips' placement in the reconstituted wafer has to match the layout of IOs 210A of super chip 110N before super chip attachment. In FIG. 10A, each plain chip is separately aligned with the super chip without being constrained by the other plain chips' positions.

When the chips of sub-module 204.0 have thus been attached to each other, the chip assembly is taken off the vacuum stage and turned upside down to form long connections 350 on contact pads 210B of chips 110F as described above in connection with FIG. 3B-1. Alternatively or in addition, e.g. for the MCM of FIG. 3D, the connections 350 can be provided on super chip 110N and/or other chips while the chips are still held by stage 910. Encapsulant 360 and underfill 380 can be deposited as described above, before or after the chip assembly is taken off the vacuum stage. Then WB 120 and the TIM 384 are provided, and the module 204.0 is attached to the WB, as described above in connection with FIGS. 3B-1 and 3B-2 or other figures for example.

Figure 11A:
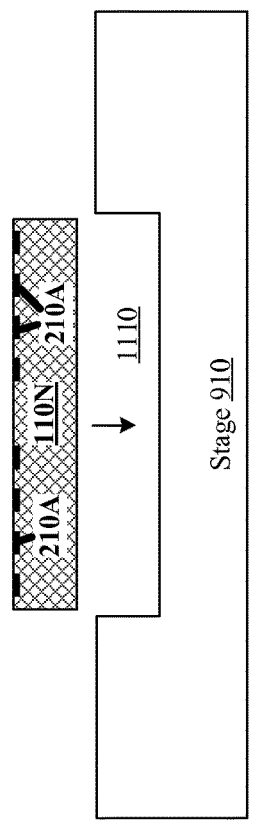

As shown in FIG. 11A, vacuum stage 910 may have a pocket 1110 to house the super chip(s) 110N. Multiple pockets of the same or different depths can be provided for different super chips. When the super chip(s) are placed into the pockets and are held in position by vacuum, plain chips 110F (FIGS. 11B, 11C) are aligned with the super chip(s). At least some plain chips 110F may laterally extend beyond the super chip(s) and beyond the pockets 1110 so that the plain chips are at least partially supported by the portions of stage 910 outside the pocket(s) 1110.

Before the super or plain chips are placed on stage 910, the top surface of the stage can be covered by a thin release film (not shown) to facilitate release of the chips after attachment of the chips to each other.

In some embodiments of the scheme of FIGS. 11B and 11C, before the plain chips are placed on the super chip(s), the plain chips' bottom surfaces are covered by an adhesive layer 1120, e.g. organic polymeric layer, to attach the plain chips to the super chip(s) without forming a bond between the IOs 210A of the plain and super chips. In such embodiments, the IO bonding is performed (using heat) after removal of the chip assembly from the stage 910. Therefore, in some embodiments, the stage 910 does not generate heat, or generates low-temperature heat just to cure the adhesive 1120. As a result, in some embodiments, heating the assembly to bond the IOs can be done at a lower temperature and/or by more localized heating (e.g. laser impinging on the IO areas).

Adhesive 1120 may serve as flux (e.g. if the attachment is by solder). For example, adhesive 1120 may be tacky flux used with an Auto-Dip system such as available from Manncorp having an office in Pennsylvania, United States. Adhesive 1120 may also function as underfill.

In the processes of FIGS. 10A-11C, stage 910 may hold the chips by other than vacuum forces, e.g. electrostatically.

Various features described above can be combined in various ways. One example is shown in FIGS. 12A-12D. In this embodiment, a sub-module 204.0 is manufactured as in FIG. 8B or 10B, and then encapsulated by molding compound 1210. If sub-module 204.0 was formed using a reconstituted wafer approach (as in FIGS. 8A-8B for example), then molding compound 1210 may incorporate the molding compound 820 of the reconstituted wafer, or alternatively the reconstituted wafer's molding compound may be at least partially removed before introducing additional molding to form the layer 1210. Molding compound layer 1210 can be any of the materials described above for molding compound 820 (FIG. 8A) or underfill/encapsulant 898 (FIG. 9E). The top surface of molding compound layer 1210 is coplanar with the top surfaces of plain chips 110F, but in other embodiments the top surfaces of molding compound 1210 and the plain chips can be at different levels as described above in connection with FIG. 9A.

The bottom surface of layer 1210 is shown as a planar surface below the super chip(s) 110N, but the bottom surfaces of the chips and the molding compound do not have to be planar or coplanar and can be at any levels relative each other.

The plain chips' IOs not attached to the super chip are marked 210X as in FIG. 9A.

As shown in FIG. 12B, the structure is then thinned from the bottom, possibly using mechanical (e.g. grinding or lapping) and/or chemical mechanical polishing (CMP) and/or other processes, to thin the molding compound 1210 and possibly some or all of super chip(s) 110N, to provide a planar bottom surface.

Of note, in some embodiments, most of molding compound 1210 is located around the chips 110F rather than above or below the chips, and hence the warpage due to the molding compound shrinkage during curing is low.

Then (FIG. 12C) molding compound 1210 is removed under the plain chips to expose the plain chips' contact pads 210X and possibly the surrounding regions. RDL 890 is formed in these regions as in FIG. 9B, to connect the plain chips' IOs 210X to the RDL's top IOs 210Y.T and bottom IOs 210Y.B. The same processes can be used as described above for FIG. 9B.

Then (FIG. 12D) TMVs 894 are formed through molding compound 1210 to reach the contact pads 210Y.T as described above in connection with FIG. 9C. IOs 894C can be formed by the top ends of TMVs 894 or additional circuitry, e.g. an RDL, formed over the TMVs, as described above in connection with FIG. 9C. Other processing can be done as described above. In particular, additional MCMs can be stacked on top with their IOs being attached to IOs 894C. For example, the MCMs of the type of FIG. 12D can be stacked above each other and attached to each other at their IOs 894C and 210Y.B.

Figure 13:
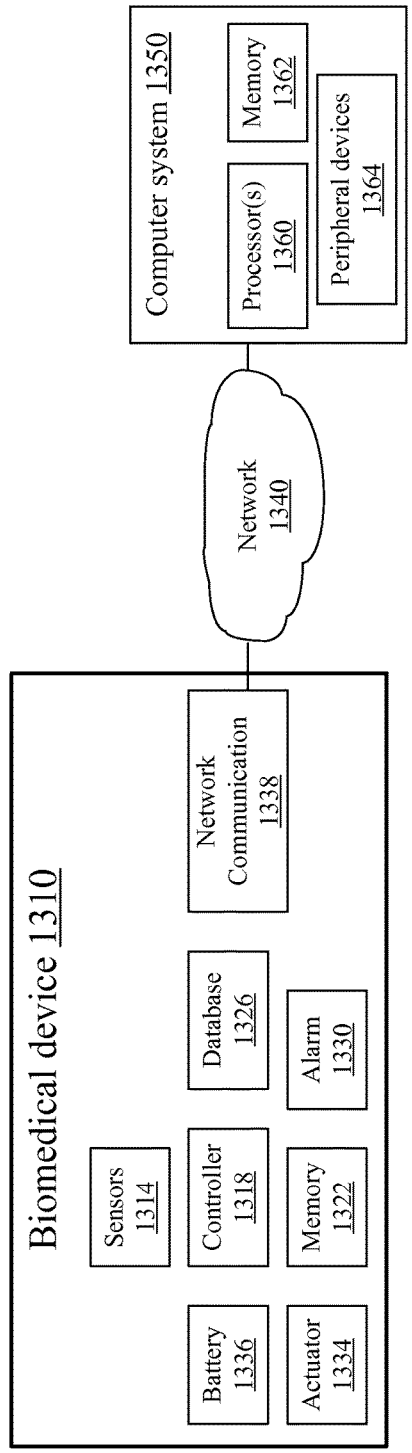
FIG. 13 is a block diagram of a health monitoring system according to some embodiments of the present invention.

The assemblies of the kind described above have many practical applications. For example, some embodiments provide a mobile biomedical device 1310 (FIG. 13) that performs health care monitoring. Device 1310 may be of the kind implanted into a patient (human or animal), or may be a wearable device worn on a patient's body, e.g. a wrist, ankle, around the waist, or in any other way. Device 1310 may contain the following parts each of which can be implemented as one or more chips:

One or more sensor chips 1314.
Controller chip 1318 (including a computer with an instruction execution unit for executing computer instructions; possibly also including memory for instruction and data storage).
Memory chip 1322 for use by controller (to store data and/or computer instructions).
Database chip 1326. This can be just memory, or can be memory with processing logic (e.g. computer processor or other type) that receives database management commands (e.g. store, read, modify) and executes the commands and returns data and/or status indicators as appropriate.
Alarm chip 1330.
Actuator chip 1334.
Battery chip 1336 (power supply), possibly together with reference voltage generators and other pertinent circuitry such as: capacitors and inductors that smoothen the voltages; and generators of low-battery-power alarm signals that can be transmitted to controller 1318 or some other chip.
Network communication chip 1338.

There can be multiple chips of each kind, e.g. multiple battery chips 1336, or multiple alarm chips 1330, etc. Vice versa, multiple chips of different kinds can be merged into a single chip; for example, the alarm chip and the controller chip can be replaced by a single chip. In another example, controller 1318 and memory 1322 are in a single chip; and/or the controller and some of the alarms 1330 are in a single chip, while other alarms are in separate chips. Any combination of chips can be merged together.

Sensor chips 1314 measure the patient's pulse rate, blood pressure, blood oxygen level, blood glucose level, and/or other biometrical and possibly non-biometrical parameters. Exemplary sensors are described in the following U.S. pre-grant patent publications incorporated herein by reference: no. 2015/0172893 (18 Jun. 2015; applicants: St. Germain et al.); no. 2015/0178456 (Jun. 25, 2015; applicants: Stransky-Heilkron et al.); no. 2015/0193595 (9 Jul. 2015; McNamara et al.). The invention is not limited to any particular sensor types.

Controller chip 1318 receives these measurements from the sensor chip(s) and analyzes these measurements in association with the general public healthcare statistical data and the patient's medical history which are stored on the database chip 1326.

If the analysis indicates an alarm condition, controller chip 1318 sends signals based on this analysis to alarm chip 1330 which generated an alarm (video and/or audio) warning the patient or the patient's care giver by sound or display. Also if the analysis so indicates, then the controller sends appropriate signals to actuator 1334 to cause the actuator to release medicine (the medicine can be stored inside the actuator, if say the actuator is a micro-electro-mechanical system (MEMS), or the medicine can be in a separate container connected to the actuator (by wired connections or wirelessly) and activated by the actuator). The controller also logs the measurements and the actions taken by the controller with regard to alarm and actuator into the patient's medical history stored in database 1326. Network communication chip 1338 provides a network interface (possibly wireless) between database 1326 and a network 1340 (network 1340 can be any suitable kind, possibly including the Internet). Network 1340 connects the device 1310 to the outside world, including possibly a computer system 1350 allowing the patient and/or medical personnel to interact with device 1310. (Computer system 1350 may include one or more processors 1360, memory 1362 storing computer programs executed by the processors and storing data used and/or generated by the processors, and may include peripheral devices 1364 such as a keyboard, a mouse, a touch screen, a display, and/or other types known or to be invented.) Using the network 1340, medical history events recorded in database 1326 by controller 1318 based on sensor data can be transferred from database 1326 through chip 1338 to computer system 1350, and public healthcare statistical data and the patient's medical history data obtained from outside sources (e.g. from medical tests or physician's examinations) can be transferred from computer system 1350 through chip 1338 to database 1326.

In some embodiments, controller 1318 is implemented as a super chip. Some or all of memory chip(s) 1322, sensor chip(s) 1314, database chip(s) 1326, alarm chip(s) 1330, actuator chip(s) 1334, network chip(s) 1338, and battery chip(s) 1336 can be implemented as plain chips attached to the controller super chip (possibly using the scheme of FIG. 3A-2 or 3B-2 or any other scheme described above), or as stacks of chips attached to the controller super chip (as in FIG. 4C or 5 for example). Thus, in some embodiments, any number of such chip(s) can be implemented as plain chips attached to the controller super chip, while the remaining chips can be stacked on the controller chip or the plain chips (as in any one of FIGS. 3E, 4C, 5, 8D, 9E (with some chips attached to TMVs 894 or 902), or 12D for example). A WB may or may not be present. If a WB is used (possibly a course WB), some of the chips or chip stacks may be attached to the WB side by side with the controller chip and its plain chips. Such addition chips or chip stacks (i.e. chips or chip stacks in addition to the controller and its plain chips) can be assembled as a separate MCM or multiple MCMs, with or without its own WB (as in FIG. 6A or 6C or 7B-1 for example). Thus, in some embodiments, battery chip 1336 is attached to coarse WB 120 if the battery's power, ground, and reference voltages and low-battery-power alarms may have low speed requirements, i.e. are allowed to propagate relatively slowly to the rest of the system (through the WB lines 344 and long connections 350). The battery chip's signals may be provided to some of the chips of device 1310 through other chips of the device. In another example, in some embodiments, network communication chip 1338 is attached to the course WB and is not part of the controller/plain chip MCM. Battery chip 1336, network communication chip 1338, and/or other chips or MCMs can be attached to the same WB side as the controller with its plain chips or to the opposite WB side (as in FIG. 6A or 6C for example); such MCMs may be attached to a separate WB (e.g. as in FIG. 7A). The particular attachment architecture can be chosen based on desired dimensions of the device 1310 (e.g. an implantable device may be dimensioned differently than a wearable device) and possibly based on other factors (e.g. speed requirements). Fast operation is achieved, partly because the high-speed attachments between the sensors 1314 and the controller permit high frequency sampling and processing of sensor outputs as appropriate for life threatening situations, yet the package is compact and has low power consumption for mobile applications. The invention is not limited to mobile applications however.

Of note, in some embodiments, the implementation of FIG. 3A-2 is beneficial because it allows the sensor chips to be at the periphery of the MCM and hence in contact with the environment sensed by the sensors. Another possible implementation is as in FIG. 3E with chips 110F.3 and/or 110F.4 including sensors and chips 110F.1 and/or 110N and/or 110F.2 serving as a controller.

Another possible implementation is also as in FIG. 3E but with chip 110F.3 including sensors, chip 110F.1 including actuators, chip 110F.4 being a network communication chip, chip 110F.2 including database, and chip 110N serving as a controller. Here the network communication chip 110F.4 is connected to the database chip 110F.2 by high speed attachments (shortest possible connections formed by face-to-face bonding) for real-time data transfer.

Other implementations described above in connection with FIGS. 2A through 12D are possible. Further, any chip can be replaced by an MCM. For example, a sensor chip 1314 can be replaced by a stack of (i) a sensor chip which generates analog signals indicative of the biometrical or other parameters, and (ii) an analog-to-digital converter chip which digitizes the analog signals and provides them as sensor outputs.

Figure 14:
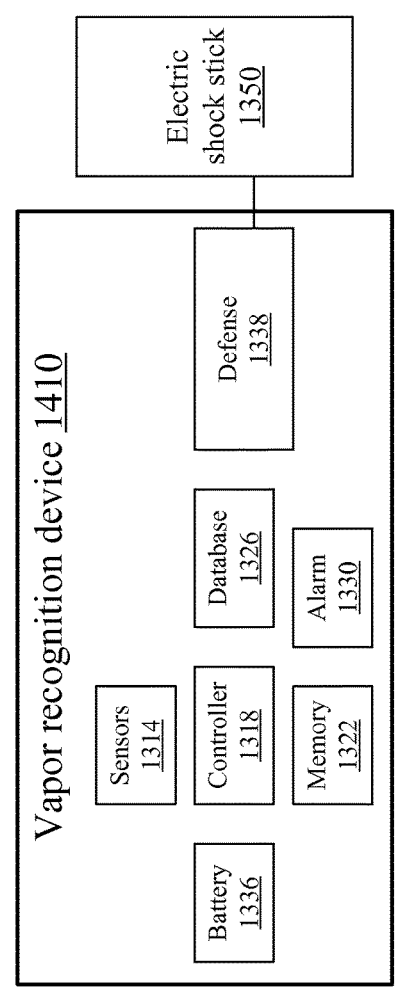
FIG. 14 is a block diagram of a vapor recognition safety system according to some embodiments of the present invention.

Another possible application is vapor-recognition device 1410 (FIG. 14) for safety monitoring. Device 1410 may be incorporated in a larger mobile device such as a mobile telephone and/or a game-playing device and/or some other type of mobile or non-mobile device. In some embodiments, vapor recognition device 1410 detects a person or a dangerous environmental condition.

For example, in some embodiments, device 1410 includes a sensor chip 1314 that senses environmental vapor and provides a continuous sensor signal pattern—a "fingerprint"—indicative of the vapor composition. Exemplary sensors are heated semiconductors whose resistance changes based on adsorption of certain gases; see e.g. U.S. Pat. No. 4,088,986 (9 May 1978; Boucher) incorporated herein by reference (the invention is not limited to such sensors). A controller chip 1318 (possibly a computer with an instruction execution unit executing computer instructions stored in the controller's on-chip memory and/or a separate memory chip 1322) takes this fingerprint and matches it against known fingerprints (of known vapors) stored in database chip 1326. For example, in case of a person recognition, the known fingerprints may include the smells emitted by the device operator and the operator's family/friends; and may include the smells emitted by criminals and/or suspects as obtained from police warning records. The controller may thus recognize the smell of a stranger (not matching the smells in database 1326) and/or of a known criminal or suspect. If such smells are detected, the controller sends a warning signal to alarm chip 1330 which pauses the game and/or phone conversation and/or other functions on the mobile device and emits sound and/or display to alert the device operator even if the operator is busy with the game or the conversation or other functions. Optionally, e.g. when recognizing a possibly dangerous person or not recognizing the smell, the controller 1318 also activates a defense chip 1338 which sends a signal (wirelessly or through a wire connection) to electric shock stick (stun gun) 1350 to allow the stick to get properly charged and ready for self-defense use by the device operator. Battery chip 1336 can be as in FIG. 13, providing power, ground, and/or reference voltages and/or low-power alarm to the other chips. If desired, a network communication chip (like 1338 in FIG. 13) can be provided for alerting the police or other people and/or for receiving updates of vapor fingerprints, computer programs, and/or other data for storage in device 1410. Each chip can be split into multiple chips (e.g. there can be multiple sensor chips 1314), or chips can be merged into a single chip, as described above for FIG. 13. So in some embodiments, the controller chip 1318 communicates with six or more types of chips—e.g. sensor 1314, database 1326, alarm 1330, defense 1338, and memory 1322—in real time at high speed for safety monitoring.

In some embodiments, vapor recognition device 1410 is part of electric shock stick 1350.

Such vapor recognition devices can be implemented by any package described above in connection with FIGS. 2A through 12D. For example, the controller can be implemented as a super chip, with the other chips being plain chips attached to the controller, or some of the other chips being plain chips attached to the controller while other chips being connected to the controller via a WB as discussed above in connection with FIG. 13. Further, any chip can be replaced by an MCM as noted above for FIG. 13.

Figure 15:
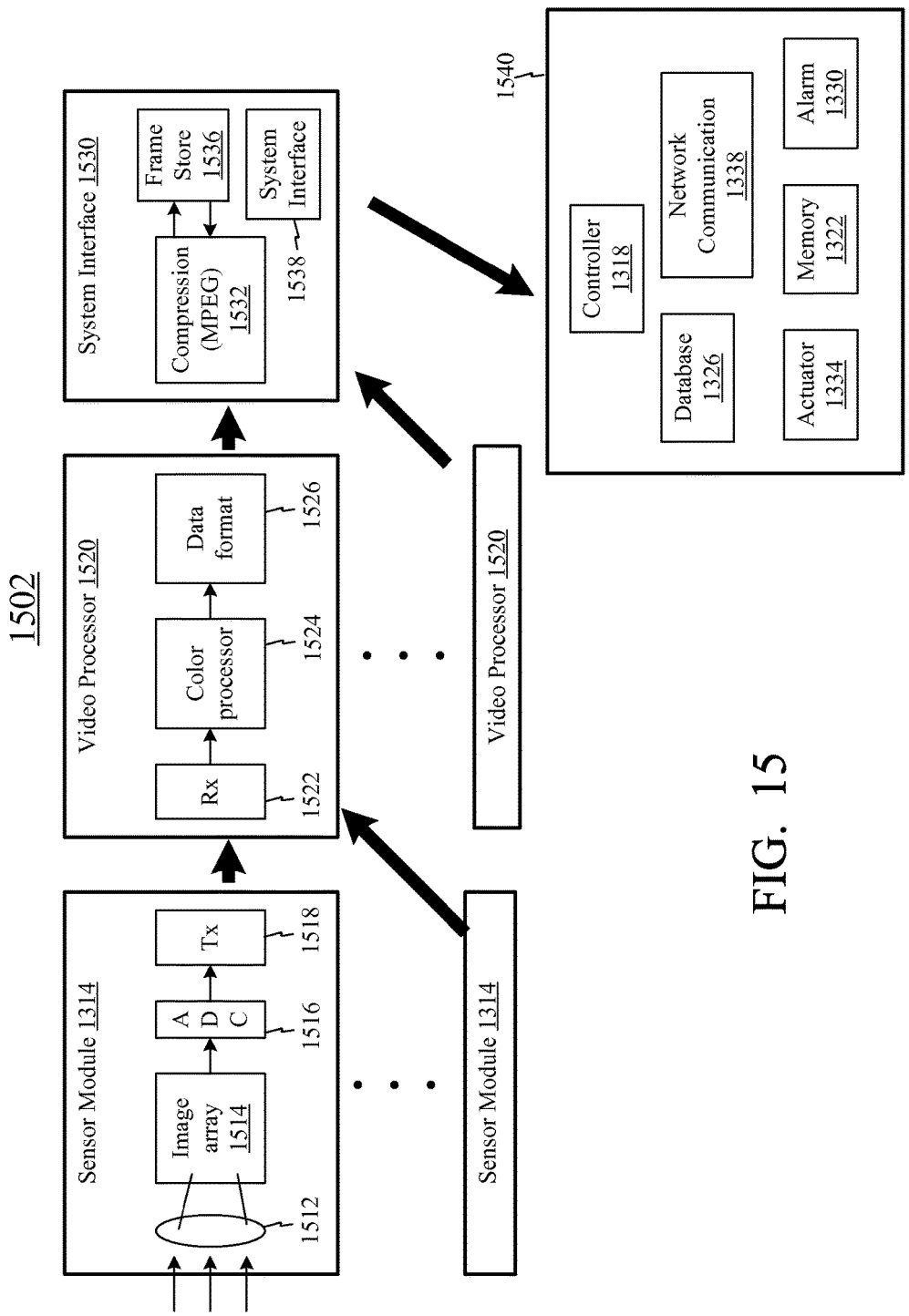
FIG. 15 is a block diagram of an optoelectronic system comprising MCMs according to some embodiments of the present invention.

Some embodiments provide an optoelectronic system, e.g. for use in a digital camera or an image recognition system, and/or for auto-pilot equipment or self-driving vehicle, or for other uses. FIG. 15 shows a functional diagram for an exemplary system 1502. The system includes one or more sensor modules 1314 each of which converts incoming light into electrical signals; one or more video processor modules 1520 each of which performs any suitable processing, e.g. image repair and/or other type of processing; and one or more system interface modules 1530 (only one is present in the example of FIG. 15) each of which performs further processing, e.g. compression, to prepare the video data for output to a control system 1540 that controls any target equipment using the video data; exemplary target systems include a digital camera's display or printer output, or equipment that controls actuators in auto-pilot or self-driving implementations.

The invention is not limited to any particular optoelectronic embodiment, and FIG. 15 shows exemplary particulars of one sensor module 1314, one video processor 1520, and one system interface module 1530 for illustration purposes (different sensor modules may or may not have the same structure; the same is true for different video processors 1520 and different system interface modules 1530). In FIG. 15, sensor module 1314 includes an optical module 1512, an analog-to-digital converter 1516, and a transmitter (Tx) 1518. Optical module 1512 is shown schematically as a lens, and possibly includes a combination of lenses, reflectors, beam splitters or combiners, waveguides, and/or other optical devices, to suitably focus, filter, and/or perform other optical processing on the incoming light. Optical module 1512 outputs the light so processed to image array 1514, which converts light to electrical signals to produce a raw analog signal indicative of the image constructed by the module 1512. In some embodiments, image array 1514 is an array of optoelectronic transducers that provide an electrical signal for each pixel of the image. The analog output of image array 1514 is converted to digital form by analog-to-digital converter 1516 to provide a raw digital image. The raw digital image is provided to transmitter (Tx) module 1518, which may perform amplification, level shifting, and/or other suitable electrical processing. Tx 1518 outputs the processed raw digital image to a video processor 1520.

Each video processor 1520 may process data from only one or multiple sensor modules 1314. In video processor 1520, the raw image from a sensor module is received by Rx module 1522 which performs amplification, level shifting, and/or other suitable electrical processing, and delivers the processed raw image to color processor 1524. Color processor 1524 generates color signals for each pixel. For example, in some embodiments, the image array 1514 outputs only one of the red, green, and blue components for each pixel, with adjacent pixels corresponding to respective different colors. Color processor 1524 interpolates the missing colors for each pixel; for example, if image array 1514 provides the blue color component for some pixel, then color processor 1524 computes the pixel's red and green components from the adjacent pixels' signals. In addition or in the alternative, color processor 1524 may perform image repair, image sharpening, and/or other image processing. The processed image is provided to data formatting module 1526 which converts the image data to a desired color coordinate system ("color space").

The output of data formatting module 1526 is provided to a system interface module 1530 for further processing as needed for the target system(s). Each system interface module 1530 may process the data from only one or multiple video processors 1520. In the example shown, interface module 1530 includes a compression module 1532 which compresses the incoming image (e.g. using MPEG4 or some other MPEG or non-MPEG compression standard). The compressed data are stored in frame store memory 1536 (e.g. semiconductor or some other type of computer memory). The data can be read out of frame store 1536 by system interface module 1538 which provides the data to the target equipment (not shown). Before being provided to the target equipment, the data can be decompressed by module 1532 if desired.

Control system 1540 receives data (e.g. compressed or uncompressed image data) from one or more, possibly all, of system interface modules 1530. Control system 1540 includes controller 1318, memory 1322, database 1326, actuator 1332, and alarm 1330 whose functions are similar to those described above in connection with FIG. 13. In particular, controller 1318 may perform analysis, pattern recognition (possibly using data in database 1326), and decision making. The decisions result in signals transmitted to actuator 1334 to actuate various actions (e.g. breaking, steering, etc.); and signals transmitted to alarm 1330 for possible alarms. Various events (e.g. decisions and alarms) can be logged by the controller in database 1326, and provided from the database to an outside computer system (such as 1350 in FIG. 13) via network communication 1338 linked to a suitable computer network (like 1340 in FIG. 13). Outside computers (e.g. like 1350 in FIG. 13) can provide suitable data (e.g. for pattern recognition) and suitable computer programs (e.g. for execution by controller 1318) to control system 1540 through network communication 1338.

Each of modules 1314, 1520, 1530 may or may not function as prior art. However, some embodiments provide novel MCM implementations of the system of FIG. 15. In some embodiments, in an image recognition system and/or for auto-pilot equipment or self-driving vehicle or for other types of target equipment, multiple digital cameras at different locations/angles for different targeted observations are deployed. Each digital camera may include a chip or an MCM implementing one sensor module 1314, with or without a video processor 1520. A separate MCM includes a control system 1540, possibly with one or more (possibly all) system interface modules 1530 and possibly with one or more (possibly all) video processors 1520. Such separate MCM can be implemented by any package described above. For example, controller 1318 can be a super chip connected to other chips of system 1540 as described above in connection with FIG. 13. System interface modules 1530 and video processors 1520, and possibly sensor modules 1314 can be part of the same MCM, possibly as additional plain chips or other chips attached to the same WB or a different WB. Different plain chips can be attached to the same or opposite sides of any super chip. As noted above, any chip can be replaced by an MCM.

FIG. 16 shows a variation using an integration chip 1610 connected to multiple sensor chips or MCMs 1314. This variation can be used with any of the structures of FIGS. 13-15 Integration chip 1610 performs any desired processing, e.g. averaging of the sensors' digital outputs to remove noise, and/or integration chip 1610 may integrate the sensors' digital outputs into a holistic pattern for gesture recognition, situation analysis, or some other purpose. Sensor chips or MCMs 1314 can be plain chips attached to integration chip 1610 as a super chip. Integration chip 1610 can be attached to controller 110N as a plain chip to a super chip, together with other plain chips as in FIGS. 13-15. Integration chip 1610 may be attached to some sensors but not to others.

The assemblies described above in connection with FIGS. 13-16 may be used with other types of sensors, e.g. sensors that sense motion, acceleration, magnetic or electric fields, or other types of transducers. The same assembly may include different types of sensors. The invention is not limited to the embodiments discussed above. Some embodiments of the invention are described by the following numbered clauses:

Clause 1. An assembly comprising:
a wiring board comprising circuitry comprising a plurality of contact pads at a top side of the wiring board;
a plurality of first chips (e.g. 110F in FIG. 3A-2), each first chip comprising circuitry which comprises:
one or more first contact pads at a bottom side of the first chip; and
one or more second contact pads at the bottom side of the first chip that are directly connected to one or more of the contact pads of the wiring board;
a second chip (e.g. 110N) overlying the wiring board and comprising circuitry comprising a plurality of first contact pads at a top side of the second chip, wherein at least one first contact pad of each first chip is attached to at least one first contact pad of the second chip;

wherein at least one direct connection (e.g. 350) of at least one second contact pad of at least one first chip to at least one of the contact pads of the wiring board lies between the first chip and the wiring board and is longer than a thickness of the second chip.

2. The assembly of clause 1 wherein for any two of said contact pads directly connected to each other, one of the two contact pads lies directly above the other one of the two contact pads.

3. The assembly of clause 1 or 2 wherein for each first chip, at least one first contact pad of the first chip is attached to at least one first contact pad of the second chip by an attachment which lies in its entirety above the second chip and below the first chip.

4. The assembly of clause 1, 2, or 3 wherein each direct connection between a second contact pad of a first chip and a contact pad of the wiring board lies along a vertical line.

5. The assembly of any preceding clause wherein at least one direct connection between at least one second contact pad of at least one first chip and at least one contact pad of the wiring board lies entirely below the first chip.

6. The assembly of any preceding clause wherein the wiring board is based on a substrate of a non-semiconductor material which supports the circuitry of the wiring board.

7. The assembly of clause 6 wherein the wiring board comprises one or more through-holes comprising a material of a higher thermal conductivity (e.g. TIM 384) than the substrate.

8. The assembly of clause 6 or 7 further comprising a region between the second chip and the wiring board, the region being filled with a material of a higher thermal conductivity than the substrate.

9. The assembly of any preceding clause further comprising one or more third chips (e.g. 110F.3 in FIG. 4C), each third chip comprising circuitry comprising one or more contact pads at a bottom side of the third chip;

wherein the circuitry of at least one first chip comprises one or more third contact pads at a top side of the first chip, each third contact pad being attached to one of the one or more contact pads of at least one third chip.

10. The assembly of clause 9 wherein the circuitry of at least one first chip comprises at least one contact pad located at a top side of the first chip and directly connected, by a discrete wire, to a contact pad that belongs to the circuitry of at least one third chip and is located at a top side of the third chip.

11. The assembly of clause 10 further comprising one or more fourth chips, each fourth chip comprising circuitry comprising one or more contact pads at a bottom side of the fourth chip;

wherein the circuitry of at least one third chip comprises, at a top side of the third chip, one or more contact pads each of which is attached to one of the one or more contact pads of at least one fourth chip (e.g. as in FIG. 4C).

12. The assembly of any preceding clause wherein the circuitry of at least one first chip further comprises at least one contact pad located at a top side of the first chip and directly connected to at least one contact pad of the circuitry of the second chip by a discrete wire (e.g. 394 in FIG. 4C).

13. The assembly of any preceding clause wherein the circuitry of the second chip further comprises at least one contact pad at a bottom side of the second chip which contact pad is attached to a contact pad of the circuitry of the wiring board (e.g. as in FIG. 5).

14. The assembly of any preceding clause wherein the circuitry of the second chip further comprises at least one contact pad at a bottom side of the second chip which contact pad is attached to a contact pad of the circuitry of the wiring board.

15. An assembly comprising a plurality of sub-assemblies comprising a first sub-assembly which comprises the assembly of any preceding clause, each sub-assembly comprising a wiring board comprising circuitry comprising a plurality of contact pads;

wherein at least one said contact pad of the wiring board of the first sub-assembly is attached to at least one said contact pad of the wiring board of another one of the sub-assemblies. (See FIG. 7A for example.)

16. The assembly of clause 1 wherein at least one first chip comprises at least one of a sensor or an actuator, and the second chip comprises a controller configured to either receive an electrical output provided by the sensor or to provide an electrical input to the actuator or both, through at least one attachment of at least one first contact pad of the controller to at least one first contact pad of the first chip. (See FIG. 16 for example, the actuator may correspond to action chip 110F.5.)

17. An assembly comprising:

a wiring board (e.g. 120 in FIG. 3D or 3E) comprising circuitry comprising a plurality of contact pads at a top side of the wiring board;

a plurality of first chips (e.g. 110F) overlying the wiring board and having their bottom sides attached to the wiring board, wherein each first chip comprises circuitry which comprises one or more first contact pads at a top side of the first chip; and a second chip (e.g. 110N) overlying the wiring board and comprising circuitry comprising a plurality of first contact pads at a bottom side of the second chip which are attached to the first contact pads of the first chips;

wherein at least one of the first and second chips comprises one or more second contact pads directly connected to one or more of the contact pads of the wiring board.

18. The assembly of clause 17 wherein for any two of said contact pads directly connected to each other, one of the two contact pads lies directly above the other one of the two contact pads.

19. The assembly of clause 17 or 18 wherein for each first chip, at least one first contact pad of the first chip is attached to at least one first contact pad of the second chip by an attachment which lies in its entirety above the first chip and below the second chip.

20. The assembly of clause 17, 18, or 19 wherein the second chip comprises one or more of said second contact pads directly connected to one or more of the contact pads of the wiring board, and each direct connection between a second contact pad of the second chip and a contact pad of the wiring board lies along a vertical line.

21. The assembly of clause 17, 18, 19 or 20 the second chip comprises one or more of said second contact pads directly connected to one or more of the contact pads of the wiring board, and at least one direct connection between at least one second contact pad of the second chip and at least one contact pad of the wiring board lies entirely below the second chip.

22. The assembly of clause 17, 18, 19, 20, or 21 wherein each first chip of one or more of the first chips comprises one or more third contact pads at the top side of the first chip, and the assembly further comprises one or more third chips (e.g. 110F.3) each of which comprises, at its bottom side, one or more contact pads attached to one or more of the one or more third contact pads of the one or more first chips.

23. An assembly comprising a plurality of sub-assemblies comprising a first sub-assembly which comprises the assembly of clause 17, 18, 19, 20, 21, or 22, each sub-assembly comprising a wiring board comprising circuitry comprising a plurality of contact pads;

wherein at least one said contact pad of the wiring board of the first sub-assembly is attached to at least one said contact pad of the wiring board of another one of the sub-assemblies. (See FIG. 7A for example)

24. The assembly of clause 17, 18, 19, 20, 21, 22 or 23 wherein at least one first chip comprises at least one of a sensor or an actuator, and the second chip comprises a controller configured to either receive an electrical output provided by the sensor or to provide an electrical input to the actuator or both, through at least one attachment of at least one first contact pad of the controller to at least one first contact pad of the first chip.

25. An assembly comprising:

a wiring board comprising circuitry comprising a plurality of contact pads at a top side of the wiring board, the wiring board comprising a cavity at the top side (e.g. as in FIG. 3C);

a plurality of first chips, each first chip comprising circuitry which comprises:

one or more first contact pads at a bottom side of the first chip; and one or more second contact pads at the bottom side of the first chip that are directly connected to one or more of the contact pads of the wiring board;

a second chip overlying the wiring board and partially located in the cavity, the second chip comprising circuitry comprising a plurality of first contact pads at a top side of the second chip that are attached to one or more of the first contact pads of the first chip;

wherein at least one direct connection of at least one second contact pad of at least one first chip to at least one of the contact pads of the wiring board lies between the first chip and the wiring board and is longer than at least one attachment between at least one first contact pad of the first chip to at least one first contact pad of the second chip.

26. An assembly comprising:

a first wiring board comprising circuitry comprising a plurality of contact pads at a bottom side of the first wiring board (see FIG. 7B-1; the wiring board can be any interposer 120);

a single-chip or multi-chip module (e.g. 204) underlying the wiring board and comprising circuitry comprising one or more first contact pads attached to one or more of said contact pads of the wiring board;

a second wiring board (e.g. 120' in FIG. 7B-1) underlying the module and comprising circuitry comprising one or more contact pads at a top side of the second wiring board which are directly connected to one or more of said contact pads of the first wiring board.

27. The assembly of clause 26 wherein each direct connection between at least one said contact pad of the first wiring board and at least one said contact pad of the second wiring board lies entirely below the first wiring board and above the second wiring board.

28. An assembly comprising:

a wiring board (e.g. 120 in FIG. 6A or 6C) comprising circuitry comprising one or more contact pads at a top side of the wiring board and one or more contact pads at a bottom side of the wiring board;

a first plurality of chips attached to a top side of the wiring board and comprising:

one or more first chips (e.g. top chip 110N in FIG. 6A or top chips 110F in FIG. 6C), each first chip comprising circuitry comprising one or more first contact pads at a top side of the first chip; and one or more second chips (e.g. top chips 110F in FIG. 6A or chip 110N in FIG. 6C), each second chip comprising circuitry comprising one or more second contact pads at a bottom side of the second chip which are attached to respective one or more of the first contact pads of one or more of the first chips;

wherein the circuitry of at least one second chip comprises one or more contact pads at the bottom side of the second chip which are directly connected to one or more contact pads at the top side of the wiring board;

wherein the assembly further comprises:

a second plurality of chips attached to a bottom side of the wiring board and comprising:

one or more first chips (e.g. bottom chip 110N in FIG. 6A), each first chip of the second plurality comprising circuitry comprising one or more first contact pads at a bottom side of the first chip; and one or more second chips, each second chip of the second plurality comprising circuitry comprising one or more second contact pads at a top side of the second chip which are attached to respective one or more of the first contact pads of one or more of the first chips of the second plurality;

wherein the circuitry of at least one second chip of the second plurality comprises one or more contact pads at the top side of the second chip which are directly connected to one or more contact pads at the bottom side of the wiring board. (The clauses are not limited to the embodiments discussed in the clauses; for example, clause 28 also covers an embodiment similar to FIG. 6A but with the MCMs of FIG. 3E attached to the top and/or bottom of the WB, and/or with other MCMs attached to the WB).

29. A manufacturing process comprising:

obtaining a plurality of first modules (e.g. 110F in FIG. 8A) each of which comprises circuitry with one or more contact pads, each first module being a single-chip or multi-chip module;

placing a molding compound (e.g. 820) in physical contact with each first module, and curing the molding compound, to form a first structure in which the first modules are held together by at least the molding compound, wherein the circuitry of each of at least two of the first modules has one or more contact pads exposed in the first structure;

obtaining one or more second modules each of which comprises circuitry with one or more contact pads, each second module being a single-chip or multi-chip module;

assembling the first structure and the one or more second modules to form a sub-module in which the second and first modules are interconnected through the contact pads of the first and second modules;

attaching the sub-module to a wiring board comprising circuitry and one or more contact pads, to obtain a third module in which at least one of the first and second modules and the circuitry of the wiring board are interconnected through the one or more of said contact pads of the wiring board.

30. A manufacturing process comprising:

obtaining a plurality of first modules (e.g. 110F in FIG. 9A) each of which is a single-chip or multi-chip module comprising circuitry;

placing first molding compound in physical contact with each first module, and curing the first molding compound, to form a first structure in which the first modules are held together by at least the first molding compound, wherein the circuitry of each of at least two of the first modules has one or more first contact pads and one or more second contact pads on a bottom side of the first structure;

forming one or more layers on the bottom side of the first structure, the one or more layers providing bottom-side circuitry (e.g. RDL 890) connected to one or more of the second contact pads (e.g. 210X) on the bottom side of the first structure;

forming one or more first through-holes through the first molding compound, each first through-hole passing between top and bottom sides of the first molding compound; and forming one or more first conductive vias (e.g. TMVs 894) in the one or more first through-holes, each first conductive via reaching and physically contacting the bottom-side circuitry, each first conductive via being accessible from the top side of the first molding compound.

31. The process of clause 30 further comprising:

obtaining one or more second modules (e.g. 110N) each of which comprises circuitry with one or more first contact pads (e.g. 210A), each second module being a single-chip or multi-chip module; and attaching each second module below the bottom side of the first structure to form an assembly in which each second module and the first modules are interconnected through the first contact pads of the first and second modules.

32. The process of clause 31 further comprising:

forming second molding compound (e.g. 898) on a bottom side of the assembly;

forming one or more second through-holes through the second molding compound, each second through-hole passing between top and bottom sides of the second molding compound; and forming one or more second conductive vias in the one or more second through-holes, each second conductive via reaching and physically contacting the bottom-side circuitry, each second conductive via being accessible from the bottom side of the second molding compound.

33. A manufacturing process comprising:

obtaining a plurality of assemblies, wherein obtaining each of the assemblies comprises performing a process according to clause 32; and forming a stack of said assemblies, wherein for each two adjacent assemblies in the stack, at least one second conductive via of one of the two adjacent assemblies is attached to at least one first conductive via of the other one of the two adjacent assemblies.

34. A manufacturing process comprising:

obtaining a plurality of first modules (e.g. 110F in FIG. 12A) each of which comprises circuitry with one or more first contact pads, each first module being a single-chip or multi-chip module;

obtaining one or more second modules (e.g. 110N in FIG. 12A) each of which comprises circuitry with one or more first contact pads, each second module being a single-chip or multi-chip module;

attaching the one or more first contact pads of the one or more second modules to the one or more first contact pads of the first modules so that all the first modules are on top side of each second module, and placing first molding compound (e.g. 1210) in physical contact with each first and second module, and curing the first molding compound, to form a first structure in which the first and second modules are held together by at least the first molding compound, wherein the circuitry of each of at least two of the first modules has one or more second contact pads on a bottom side of the first structure;

thinning the first molding compound from the bottom side of each second module;

after said thinning, forming one or more layers on the bottom side of the first structure, the one or more layers providing bottom-side circuitry (e.g. RDL 890) connected to one or more of the second contact pads located on the bottom side of the first structure;

forming one or more first through-holes through the first molding compound, each first through-hole passing between top and bottom sides of the first molding compound; and forming one or more first conductive vias (e.g. TMVs 894) in the one or more first through-holes, each first conductive via reaching and physically contacting the bottom-side circuitry, each first conductive via being accessible from the top side of the first molding compound.

35. The process of clause 34 further comprising thinning at least one second module during said thinning of the first molding compound.

36. A manufacturing process comprising:

obtaining a plurality of assemblies, wherein obtaining each of the assemblies comprises performing a process according to claim 34; and forming a stack of said assemblies, wherein for each two adjacent assemblies in the stack, the bottom-side circuitry of one of the two adjacent assemblies comprises, on bottom, one or more contact pads attached to one or more first conductive vias of the other one of the two adjacent assemblies.

37. A microelectronic structure comprising:

a first structure comprising:

a plurality of first modules each of which comprises circuitry, each first module being a single-chip or multi-chip module;

first molding compound in physical contact with each first module, wherein the first modules are held together by at least the first molding compound, wherein the circuitry of each of at least two of the first modules has first and second contact pads on a bottom side of the first structure;

wherein the microelectronic structure further comprises:

one or more layers on the bottom side of the first structure, the one or more layers providing bottom-side circuitry directly connected to each second contact pad on the bottom side of the first structure;

one or more first through-holes through the first molding compound, each first through-hole passing between top and bottom sides of the first molding compound;

one or more first conductive vias in the one or more first through-holes, each first conductive via reaching and physically contacting the bottom-side circuitry, each first conductive via being accessible from the top side of the first molding compound;

one or more second modules each of which comprises circuitry with one or more first contact pads, each second module being a single-chip or multi-chip module, each second module being attached below the bottom side of the first structure to form an assembly in which each second module and the first modules are interconnected through the first contact pads of the first and second modules;

second molding compound on a bottom side of the assembly (of note, the first and second molding compounds may or may not be formed in a single molding operation);

one or more second through-holes through the second molding compound, each second through-hole passing between top and bottom sides of the second molding compound; and one or more second conductive vias in the one or more second through-holes, each second conductive via reaching and physically contacting the bottom-side circuitry, each second conductive via being accessible from the bottom side of the first molding compound.

38. A microelectronic structure comprising:
 a first structure comprising:
  a plurality of first modules each of which comprises circuitry, each first module being a single-chip or multi-chip module;
  first molding compound in physical contact with each first module, wherein the first modules are held together by at least the first molding compound, wherein the circuitry of each of at least two of the first modules has first and second contact pads on a bottom side of the first structure;
   wherein the microelectronic structure further comprises:
   one or more layers on the bottom side of the first structure, the one or more layers providing bottom-side circuitry directly connected to each second contact pad on the bottom side of the first structure, the bottom-side circuitry comprising one or more contact pads at a bottom side of the bottom-side circuitry;
   one or more first through-holes through the first molding compound, each first through-hole passing between top and bottom sides of the first molding compound;
   one or more first conductive vias in the one or more first through-holes, each first conductive via reaching and physically contacting the bottom-side circuitry, each first conductive via being accessible from the top side of the first molding compound;
   one or more second modules each of which comprises circuitry with one or more first contact pads, each second module being a single-chip or multi-chip module, each second module being attached below the bottom side of the first structure to form an assembly in which each second module and the first modules are interconnected through the first contact pads of the first and second modules;
   second molding compound on a bottom side of the assembly in physical contact with the first and second modules, the second molding compound not covering the one or more contact pads of the bottom side circuitry (of note, the first and second molding compounds may or may not be formed in a single molding operation).

39. A manufacturing process comprising:
 obtaining a plurality of first modules each of which comprises circuitry with one or more first contact pads, each first module being a single-chip or multi-chip module;
 obtaining a second module each of which comprises circuitry with one or more second contact pads, each second module being a single-chip or multi-chip module;
 holding the second module on a holding stage with the one or more second contact pads facing away from the holding stage;
 with the second module being held on the holding stage, attaching the first modules to the second module such that the one or more first contact pads of each first module become attached to one or more second contact pads, so that the first modules become fastened to each other through the second module in the attaching operation.

40. The manufacturing process of clause 39 wherein in the attaching operation, the second module is held in a pocket in the holding stage, and at least one first module is attached to the second module so that the first module is supported by an area of the holding state beyond the pocket.

The invention is not limited to the embodiments described above. Further, features of different embodiments can be combined in a single embodiment. The invention is not limited to particular materials, dimensions, or fabrication processes. Other embodiments and variations are within the scope of the invention, as defined by the appended claims.

The invention claimed is:
1. An assembly comprising:
 a wiring board comprising a plurality of contact pads at each of a top side and a bottom side of the wiring board;
 a first multi-chip module directly connected to the plurality of contact pads on the top side of the wiring board;
 a second multi-chip module directly connected to the plurality of contact pads on the bottom side of the wiring board;
 each of the first multi-chip module and the second multi-chip module comprising:
  a plurality of first chips, each first chip of the plurality of first chips comprising:
   a plurality of first contact pads at a contact side of the first chip;
   a plurality of second contact pads at the contact side of the first chip;
  a second chip comprising a plurality of third contact pads at a contact side of the second chip; and
  at least one first contact pad of the plurality of first contact pads of each of the plurality of first chips directly interconnected to at least one third contact pad of the plurality of third contact pads of the second chip;
 at least one second contact pad of the plurality of second contact pads of each of the plurality of first chips of the first multi-chip module interconnected to at least one of the plurality of contact pads on the top side of the wiring board;
 at least one second contact pad of the plurality of second contact pads of each of the plurality of first chips of the second multi-chip module interconnected to at least one of the plurality of contact pads on the bottom side of the wiring board:
 a first plurality of direct connections respectively interconnected between the plurality of contact pads on the top side of the wiring board and the at least one second contact pad of the plurality of second contact pads of each of the plurality of first chips of the first multi-chip module;
 a second plurality of direct connections respectively interconnected between the plurality of contact pads on the bottom side of the wiring board and the at least one second contact pad of the plurality of second contact pads of each of the plurality of first chips of second first multi-chip module; and
 wherein the first plurality of direct connections and the second plurality of direct connections are longer than a thickness of the second chip of the first multi-chip module and the second multi-chip module, respectively.

2. The assembly according to claim 1, wherein the wiring board is an interposer.

3. The assembly according to claim 1, wherein at least one of the plurality of first chips of the first multi-chip module or the second multi-chip module comprises at least one of a sensor or an actuator, and the second chip of the first multi-chip module or the second multi-chip module, respectively, comprises a controller configured to either receive an electrical output provided by the sensor or to provide an electrical input to the actuator or both, through at least one interconnection of at least one of the plurality of third contact pads of the second chip associated with the controller to at least one of the first contact pads associated with the sensor or the actuator.

4. An apparatus for a microelectronic device, comprising:
an interposer comprising a plurality of pads at each of a top side and a bottom side thereof;
a first multi-chip module directly connected to the plurality of pads on the top side of the interposer;
a second multi-chip module directly connected to the plurality of pads on the bottom side of the interposer;
each of the first multi-chip module and the second multi-chip module comprising:
a first integrated circuit die having first contacts;
a second integrated circuit die and a third integrated circuit die each partially overlapping for the first multi-chip module and each partially underlapping for the second multi-chip module the first integrated circuit die respectively thereof; and
each of the second integrated circuit die and the third integrated circuit die having a first portion of second contacts coupled to the first contacts for electrical conductivity;
conductors at first ends thereof coupled to a second portion of the second contacts of each of the second integrated circuit die and the third integrated circuit die for electrical conductivity;
the conductors at second ends thereof opposite the first ends coupled to the pads of the interposer for electrical conductivity; and
the conductors having a height greater than a thickness of the first integrated circuit die for having the first integrated circuit die in a region between the conductors and between a surface portion of the interposer and corresponding facing surfaces of the second integrated circuit die and the third integrated circuit die with respect to the surface portion of the interposer.

5. The apparatus according to claim 4, wherein the conductors are wire bond wires.

6. The apparatus according to claim 4, wherein the conductors are a conductive material in holes defined in a molding material with an airgap between a surface of the molding material and facing surfaces of the second integrated circuit die and the third integrated circuit die.

7. The apparatus according to claim 4, wherein the conductors are solder lines, solder balls or stacks of solder balls.

8. The apparatus according to claim 1, wherein the first multi-chip module and the second multi-chip module respectively comprise the first plurality of direct connections and the second plurality of direct connections.

9. The apparatus according to claim 8, wherein each of the first multi-chip module and the second multi-chip module comprise a molding material disposed along sides of the first plurality of direct connections and the second plurality of direct connections, respectively thereof.

10. The apparatus according to claim 9, wherein the first plurality of direct connections and the second plurality of direct connections respectively include first wire bonds and second wire bonds.

11. The apparatus according to claim 9, wherein the first plurality of direct connections and the second plurality of direct connections respectively include a first conductive material and a second conductive material respectively in holes defined in the molding material of each of the first multi-chip module and the second multi-chip module.

12. The apparatus according to claim 9, wherein the first plurality of direct connections and the second plurality of direct connections include solder lines, solder balls or stacks of solder balls.

13. The apparatus according to claim 1, wherein a non-contact side of the second chip of each of the first multi-chip module and the second multi-chip module is spaced apart from the top side and the bottom side, respectively, of the wiring board.

14. The apparatus according to claim 1, wherein the non-contact side of the second chip of each of the first multi-chip module and the second multi-chip module is spaced apart from the top side and the bottom side, respectively, of the wiring board leaving an airgap therebetween.

* * * * *